(12) United States Patent
Yamada et al.

(10) Patent No.: US 11,171,638 B2
(45) Date of Patent: Nov. 9, 2021

(54) ELECTRONIC APPARATUS

(71) Applicant: DENSO CORPORATION, Kariya (JP)

(72) Inventors: Sho Yamada, Tokai (JP); Yosuke Watanabe, Okazaki (JP); Junichi Fukuta, Kuwana (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 553 days.

(21) Appl. No.: 14/168,388

(22) Filed: Jan. 30, 2014

(65) Prior Publication Data

US 2014/0218099 A1 Aug. 7, 2014

(30) Foreign Application Priority Data

Feb. 4, 2013 (JP) .............................. JP2013-019607

(51) Int. Cl.
*H03K 17/0412* (2006.01)
(52) U.S. Cl.
CPC ............................... *H03K 17/0412* (2013.01)
(58) Field of Classification Search
CPC ............... H03K 17/0412; H03K 17/60; H03K 17/08112; H03K 17/127; H03K 17/162; H03K 17/168
See application file for complete search history.

(56) References Cited

U.S. PATENT DOCUMENTS

| | | | | |
|---|---|---|---|---|
| 5,227,655 A * | 7/1993 | Kayama | .............. | H01L 27/0688 257/327 |
| 5,949,273 A * | 9/1999 | Mourick | .......... | H03K 17/08128 327/324 |
| 5,977,814 A * | 11/1999 | Ishii | ...................... | H03K 17/168 327/108 |
| 5,986,484 A * | 11/1999 | Kimata | .............. | H03K 17/0828 323/908 |
| 6,271,708 B1 * | 8/2001 | Hoshi | .................. | H03K 17/164 327/377 |
| 6,285,235 B1 * | 9/2001 | Ichikawa | ........... | H03K 17/0406 326/17 |

(Continued)

FOREIGN PATENT DOCUMENTS

JP 2009-011049 1/2009

*Primary Examiner* — Lincoln D Donovan
*Assistant Examiner* — Colleen J O Toole
(74) *Attorney, Agent, or Firm* — Nixon & Vanderhye, PC

(57) ABSTRACT

An electronic apparatus is provided which includes switching elements, resonance suppression resistors which have first ends connected to control terminals of the switching elements and second ends having a common connection, an on-drive circuit which has an on-drive resistor and is connected to a drive power circuit, and which is supplied with voltage from the drive power circuit and applies electric charge to the control terminals of the switching elements via the on-drive resistor to turn on the switching elements, and an off-drive circuit which has an off-drive resistor and releases electric charge from the control terminals of the switching elements via the off-drive resistor to turn off the switching elements. A resistance of the off-drive resistor is set to be smaller than a resistance of the resonance suppression resistors. The off-drive circuit releases electric charge from the control terminals of the switching elements not via the resonance suppression resistors.

7 Claims, 9 Drawing Sheets

(56) References Cited

U.S. PATENT DOCUMENTS

| | | | |
|---|---|---|---|
| 7,492,208 B2 * | 2/2009 | Tihanyi | H01L 27/0727 327/374 |
| 9,041,457 B2 * | 5/2015 | Miyachi | H03K 17/74 323/272 |
| 2009/0002054 A1 | 1/2009 | Tsunoda et al. | |
| 2010/0039364 A1 * | 2/2010 | Lee | G09G 3/3696 345/100 |
| 2014/0015571 A1 * | 1/2014 | Wagoner | H03K 17/14 327/109 |

* cited by examiner

ELECTRONIC APPARATUS

CROSS-REFERENCE TO RELATED APPLICATION

This application is based on and claims the benefit of priority from earlier Japanese Patent Application No. 2013-19607 filed Feb. 4, 2013, the description of which is incorporated herein by reference.

BACKGROUND

Technical Field

The present invention relates to an electronic apparatus that includes switching elements which are driven by the control of the voltage at the control terminals thereof, an on-drive circuit which applies electric charge to the control terminals of the switching elements to turn on the switching elements, and an off-drive circuit which allows release of electric charge from the control terminals of the switching elements to turn off the switching elements.

Related Art

An electronic apparatus based on conventional arts includes switching elements which are driven by the control of the voltage at the control terminals thereof, an on-drive circuit which applies electric charge to the control terminals of the switching elements to turn on the switching elements, and an off-drive circuit which allows release of electric charge from the control terminals of the switching elements to turn off the switching elements. For example, a patent document JP-A-2009-011049 discloses a gate drive apparatus, as such an electronic apparatus, which is configured as follows.

The gate drive apparatus drives IGBTs (insulated gate bipolar transistors). An IGBT is a switching element which is driven with the control of the voltage at the gate. The gate drive apparatus includes a constant-voltage-pulse gate drive circuit. The constant-voltage-pulse gate drive circuit applies electric charge to the gate of each IGBT to turn on the IGBT, and allows release of electric charge from the gate of the IGBT to turn off the IGBT. The constant-voltage-pulse gate drive circuit includes an on-drive switch, an on-drive resistor, an off-drive switch and an off-drive resistor.

The on-drive switch is an element for applying electric charge to the gate of each IGBT. The on-drive resistor is an element for limiting the current that flows into the gate of the IGBT. The on-drive switch has an end connected to the positive terminal of a control power source and has the other end connected to an end of the on-drive resistor. The other end of the on-drive resistor is connected to the gate of the IGBT.

The off-drive switch is an element that allows release of electric charge from the gate of the IGBT. The off-drive resistor is an element for limiting the current that flows out of the gate of the IGBT. The off-drive switch has an end connected to an end of the off-drive resistor. The other end of the off-drive resistor is connected to the gate of the IGBT. Also, the off-drive switch has the other end connected to the negative terminal of the control power source.

When an IGBT having a large current capacity (large-current-capacity IGBT) is required to be used, the large-current-capacity IGBT may be configured by connecting a plurality of IGBTs having a small current capacity (small-current-capacity IGBTs) in parallel with each other. Specifically, in configuring the large-current-capacity IGBT, the plurality of small-current-capacity IGBTs are connected so that the collectors thereof have a common connection and the emitters thereof have a common connection. When a large-current-capacity IGBT, which is configured by the plurality of parallelly-connected small-current-capacity IGBTs, is driven by the gate drive apparatus, an end of the on-drive resistor and an end of the off-drive resistor are connected to the gates of the plurality of small-current-capacity IGBTs.

Between the gate and the emitter of a small-current-capacity IGBT, capacity components are present. Also, in lines, in which small-current-capacity IGBTs are parallelly connected to each other, inductance components are present. Therefore, an LC (inductance-capacitance) resonance circuit is configured by a closed circuit that extends through the gate and the emitter of one small-current-capacity IGBT to the emitter and the gate of another small-current-capacity IGBT. This resultantly leads to a problem of generating resonance. In order to suppress the resonance in the conventional art, resonance suppression resistors are arranged between the constant-voltage-pulse gate drive circuit and the gates of the small-current-capacity IGBTs. Thus, the current passing through the closed circuit can be suppressed. As a result, resonance can be suppressed.

The current that flows out of the gates of the small-current-capacity IGBTs can be adjusted by changing the resistance of the off-drive resistor. Accordingly, the period in which electric charge is released from the gates of the small-current-capacity IGBTs can be adjusted. In other word, the time taken for turning off the small-current-capacity IGBTs can be adjusted. Thus, the loss of the small-current-capacity IGBTs can be suppressed by changing the resistance of the off-drive resistor in accordance with the magnitude of the current passing through the small-current-capacity IGBTs. This resultantly leads to suppressing the loss of the large-current-capacity IGBT configured by the plurality of parallelly-connected small-current-capacity IGBTs.

However, in the case where the resistance of the off-drive resistor has to be set to a smaller value than the resistance of the resonance suppression resistors in order to suppress the loss of the large-current-capacity IGBT, the current that flows out of the gates of the small-current-capacity IGBTs cannot be sufficiently increased due to the influence of the resonance suppression resistors. Therefore, it is difficult to shorten the period in which electric charge is released from the gates of the small-current-capacity IGBTs, i.e. the time taken for turning off the small-current-capacity IGBTs. Thus, there has been a problem that the loss of the large-current-capacity IGBT cannot be suppressed. This problem is similarly caused in changing the resistance of the on-drive resistor.

SUMMARY

An embodiment provides an electronic apparatus which can apply electric charge to the control terminals of switching elements or allow release of electric charge from the control terminals thereof, without being influenced by resonance suppression resistors under the condition that the resistance of an on-drive resistor or an off-drive resistor is set to be smaller than the resistance of the resonance suppression resistors.

As an aspect of the embodiment, an electronic apparatus is provided which includes: a plurality of switching elements each of which has an input terminal, an output terminal and a control terminal, the input terminals having a common connection, and the output terminals having a common connection, and each of which is driven by controlling voltage at the control terminal; a plurality of resonance suppression resistors each of which has a first end and a second end, the first ends being connected to the respective control terminals of the switching elements, and the second ends having a common connection; an on-drive circuit which has at least one on-drive resistor and is connected to a drive power circuit, and which is supplied with voltage from the drive power circuit and applies electric charge to the control terminals of the switching elements via the on-drive resistor to turn on the switching elements; and an off-drive circuit which has an off-drive resistor and releases electric charge from the control terminals of the switching elements via the off-drive resistor to turn off the switching elements. A resistance of the off-drive resistor is set to be smaller than a resistance of the resonance suppression resistors. The off-drive circuit releases electric charge from the control terminals of the switching elements not via the resonance suppression resistors.

DETAILED DESCRIPTION OF THE PREFERRED EMBODIMENTS

With reference to the accompanying drawings, the present invention will be more specifically described using several embodiments. Each of the embodiments shows an example in which an electronic apparatus related to the present invention is applied to a motor control apparatus which is installed in a vehicle to control the drive motor of the vehicle.

First Embodiment

Figure 1:
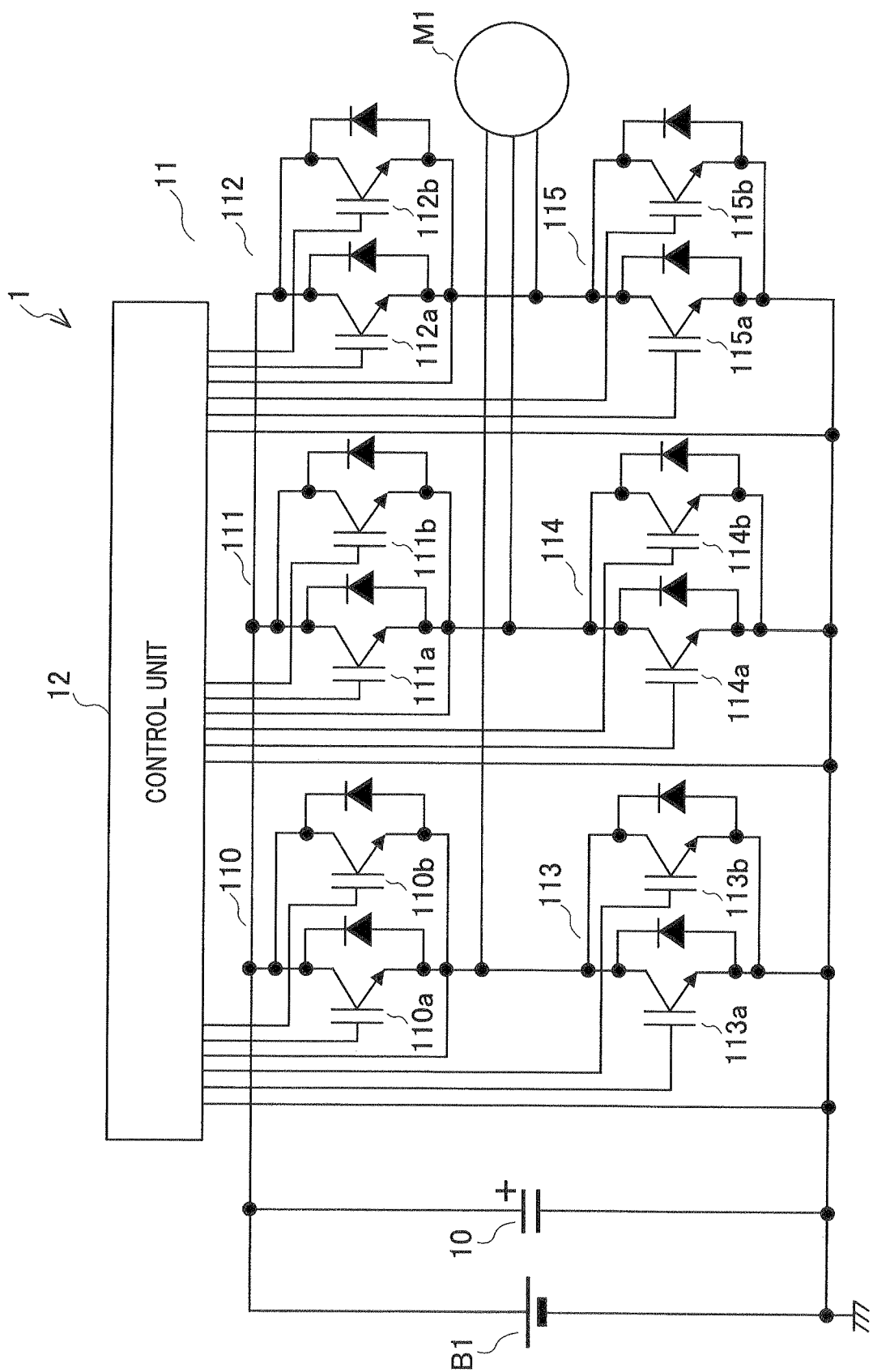
FIG. 1 is a circuit diagram illustrating a motor control apparatus according to a first embodiment of the present invention.

Referring to FIG. 1, hereinafter is described the configuration of a motor control apparatus according to a first embodiment of the present invention.

A motor control apparatus 1 (electronic apparatus) shown in FIG. 1 converts direct-current high voltage outputted from a high-voltage battery B1 to three-phase alternating-current voltage, and supplies the converted voltage to a vehicle drive motor M1 to control the motor M1. The motor control apparatus 1 includes a smoothing capacitor 10, an inverter 11 and a control unit 12.

The smoothing capacitor 10 is an element that smoothes direct-current high voltage of the high-voltage battery 131. The smoothing capacitor 10 has an end connected to a positive terminal of the high-voltage battery B1 and the other end connected to a negative terminal of the high-voltage battery B1.

The inverter 11 is a device that converts the direct-current voltage smoothed by the smoothing capacitor 10 to three-phase alternating-current voltage and supplies the converted voltage to the vehicle drive motor M1. The inverter 11 includes IGBTs (insulated gate bipolar transistors) 110 to 115.

Each of the IGBTs 110 to 115 is an element that is driven with the control of the voltage at the gate. Each of the IGBTs 110 to 115 is turned on/off to convert the direct-current voltage smoothed by the smoothing capacitor 10 to three-phase alternating voltage.

The IGBT 110 is configured by two parallelly connected small-current-capacity IGBTs 110a and 110b (plurality of switching elements). Specifically, the IGBT 110 is configured such that the collectors (input terminals) of the small-current-capacity IGBTs 110a and 110b will have a common connection and the emitters (output terminals) thereof will have a common connection. The small-current-capacity IGBTs 110a and 110b have gates, collectors and emitters, which serve as the gate, collector and emitter, respectively, of the IGBT 110. Similar to the IGBT 110, the IGBTs 111 to 115 are configured by small-current-capacity IGBTs 111a and 111b, small-current-capacity IGBTs 112a and 112b, small-current-capacity IGBTs 113a and 113b, small-current-capacity IGBTs 114a and 114b, and small-current-capacity IGBTs 115a and 115b, respectively. The IGBTs 111 to 115 are each configured such that the collectors of the small-current-capacity IGBTs will have a common connection and the emitters thereof will have a common connection. The small-current-capacity IGBTs 111a and 111b have gates, collectors and emitters, which serve as the gate, collector and emitter, respectively, of the IGBT 111. The small-current-capacity IGBTs 112a and 112b have gates, collectors and emitters, which serve as the gate, collector and emitter, respectively, of the IGBT 112. The small-current-capacity IGBTs 113a and 113b have gates, collectors and emitters, which serve as the gate, collector and emitter, respectively, of the IGBT 113. The small-current-capacity IGBTs 114a and 114b have gates, collectors and emitters, which serve as the gate, collector and emitter, respectively, of the IGBT 114. The small-current-capacity IGBTs 115a and 115b have gates, collectors and emitters, which serve as the gate, collector and emitter, respectively, of the IGBT 115.

The IGBT 110 is connected in series with the IGBT 113. The IGBT 111 is connected in series with the IGBT 114. The IGBT 112 is connected in series with the IGBT 115. Specifically, the emitters of the IGBTs 110, 111 and 112 are connected to the collectors of the IGBTs 113, 114 and 115, respectively. The serial connection of the IGBTs 110 and 113, the serial connection of the IGBTs 111 and 114 and the serial connection of the IGBTs 112 and 115 are connected in parallel with each other. Specifically, the collectors of the IGBTs 110, 111 and 112 have a common connection, while the emitters of the IGBTs 113, 114 and 115 have a common connection. The collectors of the IGBTs 110, 111 and 112 are connected to an end of the smoothing capacitor 10, while the emitters of the IGBTs 113, 114 and 115 are connected to the other end of the smoothing capacitor 10. Further, the gates and the emitters of the IGBTs 110 to 115 are connected to the control unit 12. In addition, the serial connection of the IGBTs 110 and 113, the serial connection of the IGBTs 111 and 114 and the serial connection of the IGBTs 112 and 115 each have a serial-connecting point connected to the vehicle drive motor M1.

The control unit 12 serves as a device for controlling the IGBTs 110 to 115. The control unit 12 is connected to the gates and the emitters of the IGBTs 110 to 115.

Figure 2:
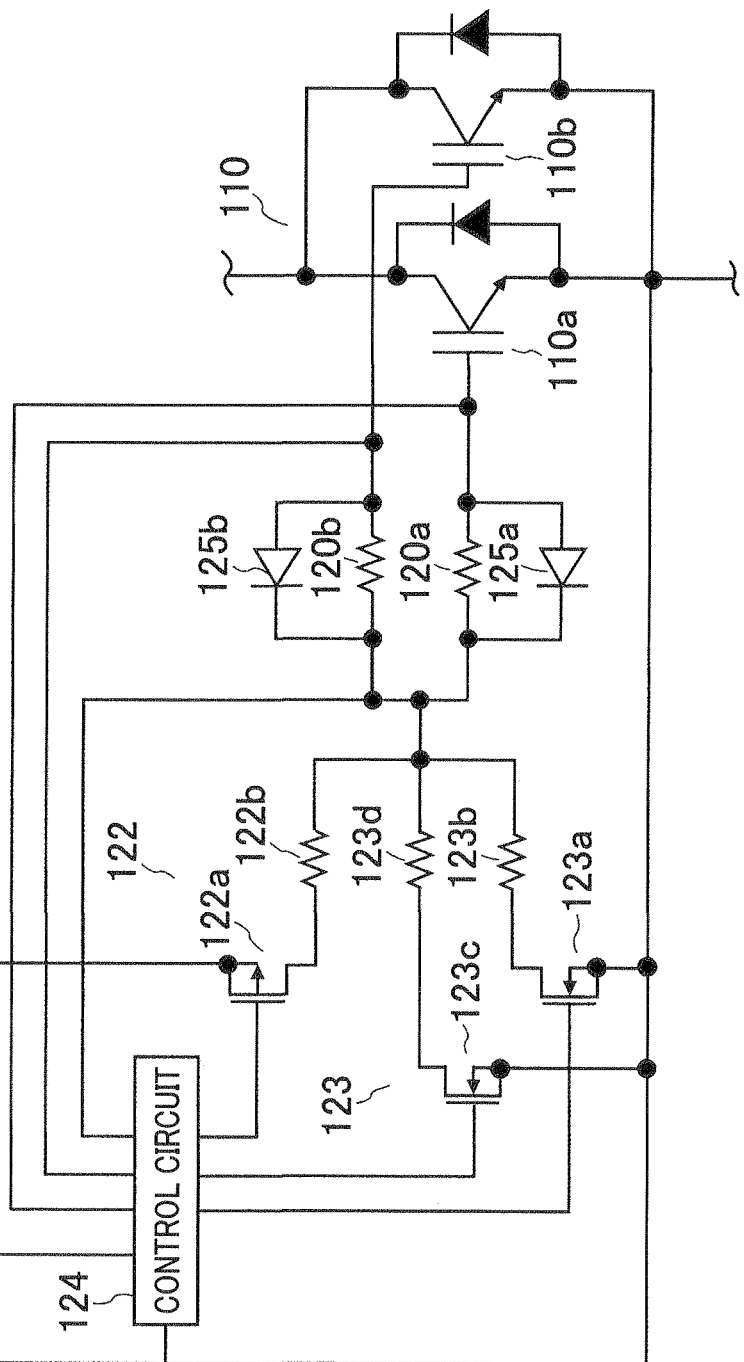
FIG. 2 is a circuit diagram illustrating a control unit used in the motor control apparatus illustrated in FIG. 1.

Referring now to FIG. 2, the control unit will be specifically described.

As shown in FIG. 2, for the IGBT 110, the control unit 12 includes two resonance suppression resistors 120a and 120b (plurality of resonance suppression resistors), a drive power circuit 121, an on-drive circuit 122, an off-drive circuit 123, a control circuit 124 and two diodes 125a and 125b (plurality of diodes). For each of the remaining IGBTs 111, 112, 113, 114 and 115 as well, the control unit 12 includes two resonance suppression resistors, a drive power circuit, an on-drive circuit, an off-drive circuit, a control circuit and two diodes.

The resonance suppression resistors 120a and 120b serve as elements that suppress current flow between the small-current-capacity IGBTs 110a and 110b to thereby suppress resonance. The resonance suppression resistor 120a has an end connected to the gate of the small-current-capacity IGBT 110a. The resonance suppression resistor 120b has an end connected to the gate of the small-current-capacity IGBT 110b. The other end of the resistor 120a and the other end of the resistor 120b have a common connection.

The drive power circuit 121 is controlled by the control circuit 124 to supply voltage required for driving the small-current-capacity IGBTs 110a and 110b to the on-drive circuit 122. Specifically, the drive power circuit 121 converts the voltage supplied from a power circuit (not shown) to a predetermined voltage required for driving the small-current-capacity IGBTs 110a and 110b and supplies the converted voltage to the on-drive circuit 122. The drive power circuit 121 has an input terminal connected to the power circuit and has a control terminal connected to the control circuit 124. The drive power circuit 121 also has a positive terminal connected to the on-drive circuit 122 and has a negative terminal connected to the emitters of the IGBTs 110a and 110b.

The on-drive circuit 122 is controlled by the control circuit 124. Under the control, the on-drive circuit 122 applies electric charge to the gates of the small-current-capacity IGBTs 110a and 110b and turns on the small-current-capacity IGBTs 110a and 110b. Specifically, the on-drive circuit 122 steps up the gate voltage of the small-current-capacity IGBTs 110a and 110b so as to be higher than a threshold voltage for turning on/off the IGBTs 110a and 110b to thereby turn on the IGBTs 110a and 110b. The on-drive circuit 122 includes an on-drive FET (field-effect transistor) 122a and an on-drive resistor 122b.

The on-drive FET 122a serves as an element that applies electric charge to the gates of the small-current-capacitor IGBTs 110a and 110b. The on-drive resistor 122b serves as an element that limits the current flowing into the gates of the small-current-capacitor IGBTs 110a and 110b when electric charge is applied to the gates by the on-drive FET 122a. The on-drive resistor 122b has a resistance which is set to a value larger than that of the resistance of the resonance suppression resistors 120a and 120b. The on-drive FET 122a has a source connected to the positive terminal of the drive power circuit 121 and a drain connected to an end of the on-drive resistor 122b. The other end of the on-drive resistor 122b is connected to a common-connecting point of the resonance suppression resistors 120a and 120b. Further, the on-drive FET 122a has a gate connected to the control circuit 124.

The off-drive circuit 123 is controlled by the control circuit 124. Under the control, the off-drive circuit 123 allows release of electric charge from the gates of the small-current-capacity IGBTs 110a and 110b and turns off the small-current-capacity IGBTs 110a and 110b. Specifically, the off-drive circuit 123 steps down the gate voltage of the small-current-capacity IGBTs 110a and 110b so as to be lower than the threshold voltage for turning on/off the IGBTs 110a and 110b to thereby turn off the IGBTs 110a and 110b. The off-drive circuit 123 includes off-drive FETs 123a and 123c and off-drive resistors 123b and 123d.

The off-drive FET 123a serves as an element that allows release of electric charge from the gates of the small-current-capacity IGBTs 110a and 110b. The off-drive resistor 123b serves as an element that limits the current flowing out of the gates of the small-current-capacity IGBTs 110a and 110b when release of electric charge from the gates is allowed by the off-drive FET 123a. The off-drive resistor 123b has a resistance which is set to a value larger than that of the resistance of the resonance suppression resistors 120a and 120b. The off-drive FET 123a has a drain connected to an end of the off-drive resistor 123b. The other end of the off-drive resistor 123b is connected to the common-connecting point of the resonance suppression resistors 120a and 120b. The off-drive FET 123a has a source connected to the emitters of the small-current-capacity IGBTs 110a and 110b and a gate connected to the control circuit 124.

The off-drive FET 123c serves as an element that allows release of electric charge from the gates of the small-current-capacity IGBTs 110a and 110b. The off-drive resistor 123d serves as an element that limits the current flowing out of the gates of the small-current-capacity IGBTs 110a and 110b when release of electric charge from these gates is allowed by the off-drive FET 123c. The off-drive resistor 123d has a resistance which is set to a value smaller than that of the resistance of the resonance suppression resistors 120a and 120b. The off-drive FET 123c has a drain connected to an end of the off-drive resistor 123d. The other end of the off-drive resistor 123d is connected to the common-connecting point of the resonance suppression resistors 120a and 120b. The off-drive FET 123c has a source connected to the emitters of the small-current-capacity IGBTs 110a and 110b and a gate connected to the control circuit 124.

The control circuit 124 controls the drive power circuit 121 on the basis of the forward voltage of the diodes 125a and 125b and adjusts the output voltage of the drive power circuit 121. At the same time, the control circuit 124 controls the on-drive FET 122a and the off-drive FETs 123a and 123c on the basis of externally inputted drive signals to drive the small-current-capacity IGBTs 110a and 110b. The control circuit 124 is connected to the diodes 125a and 125b and to the control terminal of the drive power circuit 121. The control circuit 124 is also connected to the gates of the on-drive FET 122a and the off-drive FETs 123a and 123c.

The diodes 125a and 125b serve as elements that allow release of electric charge from the gates of the small-current-capacity IGBTs 110a and 110b, respectively, not via the resonance suppression resistors 120a and 120b, respectively. The diodes 125a and 125b also serve as elements that suppress current flow between the small-current-capacity IGBTs 110a and 110b during the release of electric charge to thereby suppress resonance. The diodes 125a and 125b are connected in parallel with the resonance suppression resistors 120a and 120b, respectively. Specifically, the diode 125a has an anode connected to an end of the resonance suppression resistor 120a, the end being on the small-current-capacity IGBTs side, and has a cathode connected to the other end of the resonance suppression resistors 120a, the other end being on the opposite side of the small-current-capacity IGBTs side. Similarly, the diode 125b has an anode connected to an end of the resonance suppression resistor 120b, the end being on the small-current-capacity IGBTs side, and has a cathode connected to the other end of the resonance suppression resistors 120b, the other end being on the opposite side of the small-current-capacity IGBTs side.

Referring to FIG. 1, the operation of the motor control apparatus of the first embodiment is specifically described.

When an ignition switch (not shown) of the vehicle is turned on, the motor control apparatus 1 shown in FIG. 1 starts operation. The direct-current high voltage of the high-voltage battery B1 is smoothed by the smoothing capacitor 10. The control unit 12 controls the IGBTs 110 to 115 that configure the inverter 11, on the basis of externally inputted drive signals. Specifically, the control unit 12 turns on/off the IGBTs 110 to 115 at a predetermined cycle. The inverter 11 converts the direct-current high voltage that has been smoothed by the smoothing capacitor 10 to three-phase alternating-current voltage and supplies the converted voltage to the vehicle drive motor M1. In this way, the motor control apparatus 1 controls the vehicle drive motor M1.

Referring to FIG. 2, hereinafter is described the operation for driving the IGBTs in the motor control apparatus 1 of the first embodiment.

As shown in FIG. 2, the control circuit 124 controls the on-drive FET 122a and the off-drive FETs 123a and 123c on the basis of externally inputted drive signals to drive the small-current-capacity IGBTs 110a and 110b.

When a drive signal has an instruction to turn on the small-current-capacity IGBTs 110a and 110b, the control circuit 124 turns off the off-drive FETs 123a and 123c and turns on the on-drive FET 122a. Thus, current is permitted to flow into the gates of the small-current-capacity IGBGs 110a and 110b from the drive power circuit 121 via the on-drive FET 122a, the on-drive resistor 122b and the resonance suppression resistors 120a and 120b to thereby apply electric charge to the gates. As a result, the gate voltage becomes higher than the on/off threshold voltage and the small-current-capacity IGBTs 110a and 110b are turned on.

In this case, the control circuit 124 controls the drive power circuit 121 on the basis of the forward voltage of the diodes 125a and 125b to thereby adjust the output voltage of the drive power circuit 121. Specifically, if the forward voltage of the diodes 125a and 125b is larger than the predetermined voltage, the control circuit 124 steps down the output voltage of the drive power circuit 121 in accordance with the forward voltage of the diodes 125a and 125b. Conversely, if the forward voltage of the diodes 125a and 125b is smaller than the predetermined voltage, the control circuit 124 steps up the output voltage of the drive power circuit 121 in accordance with the forward voltage of the diodes 125a and 125b.

On the other hand, when a drive signal has an instruction to turn off the small-current-capacity IGBTs 110a and 110b, the control circuit 124 turns off the on-drive FET 122a, and at the same time, turns on the off-drive FET 123a or 123c in accordance with the collector-emitter current of the small-current-capacity IGBTs 110a and 110b.

If the off-drive FET 123a is turned on, current is permitted to flow out of the gates of the small-current-capacity IGBTs 110a and 110b via the diodes 125a and 125b, the off-drive resistor 123b and the off-drive FET 123a, and not via the resonance suppression resistors 120a and 120b, to thereby release electric charge from the gates. Then, finally, the gates of the small-current-capacity IGBTs 110a and 110 are connected to the respective emitters thereof via the resonance suppression resistors 120a and 120b, the off-drive resistor 123b and the off-drive FET 123a. Resultantly, the potential at the gates becomes equal to the potential at the emitters.

Further, if the off-drive FET 123c is turned on, current is permitted to flow out of the gates of the small-current-capacity IGBTs 110a and 110b via the diodes 125a and 125b, the off-drive resistor 123d and the off-drive FET 123c, not via the resonance suppression resistors 120a and 120b, to thereby release electric charge from the gates. Then, finally, the gates of the small-current-capacity IGBTs 110a and 110 are connected to the respective emitters thereof via the resonance suppression resistors 120a and 120b, the off-drive resistor 123d and the off-drive FET 123c. Resultantly, the potential at the gates becomes equal to the potential at the emitters.

As a result, the gate voltage becomes lower than the on/off threshold voltage, and the small-current-capacity IGBTs 110a and 110b are turned off.

The resistance of the off-drive resistor 123b is set to a value larger than that of the resistance of the resonance suppression resistors 120a and 120b. On the other hand, the resistance of the off-drive resistor 123d is set to a value smaller than that of the resistance of the resonance suppression resistors 120a and 120b. Therefore, if the off-drive FET 123c is turned on, the period in which electric charge is released from the gates of the small-current-capacity IGBTs 110a and 110b, i.e. the time required for the IGBTs 110a and 110b to be turned off, can be shortened compared to when the off-drive FET 123a is turned on. Accordingly, the loss of the small-current-capacity IGBTs 110a and 110b can be suppressed.

The forward voltage of the diodes 125a and 125b depends on temperature. Specifically, when temperature rises, the forward voltage decreases and when temperature drops, the forward voltage increases. Therefore, due to the change of the forward voltage of the diodes 125a and 125b, the change being attributed to the change of temperature, the gate voltage of the small-current-capacity IGBTs 110a and 110b is unavoidably varied when electric charge is released from the gates. However, as described above, the control circuit 124 controls the drive power circuit 121 on the basis of the forward voltage of the diodes 125a and 125b when electric charge is applied to the gates of the small-current-capacity IGBTs 110a and 110b to adjust the output voltage of the drive power circuit 121. Accordingly, the variation of the gate voltage can be suppressed when electric charge is released from the gates of the IGBTs 110a and 110b, the variation being attributed to the change in the forward voltage of the diodes 125a and 125b.

Hereinafter are described advantageous effects of the motor control apparatus according to the first embodiment.

According to the first embodiment, when a drive signal has an instruction to turn off the small-current-capacity IGBTs 110a and 110b, the control circuit 124 turns off the on-drive FET 122a. At the same time, the control circuit 124 turns on the off-drive FET 123a or 123c in accordance with the collector-emitter current of the small-current-capacity IGBTs 110a and 110b. The off-drive circuit 123 allows release of electric charge from the gates of the small-current-capacity IGBTs 110a and 110b not via the resonance suppression resistors 120a and 120b. Therefore, under the condition that the resistance of the off-drive resistor 123d is set to be smaller than the resistance of the resonance suppression resistors 120a and 120b, electric charge is released from the gates of the small-current-capacity IGBTs 110a and 110b without being influenced by the resonance suppression resistors 120a and 120b.

According to the first embodiment, the anode of the diode 125a is connected to an end of the resonance suppression resistor 120a, the end being on the small-current-capacity IGBTs side, while the cathode thereof is connected to the other end of the resistors 120a, the other end being on the opposite side of the small-current-capacity IGBTs side. Similarly, the anode of the diode 125b is connected to an end of the resonance suppression resistor 120b, the end being on the small-current-capacity IGBTs side, while the cathode thereof is connected to the other end of the resistors 120b, the other end being on the opposite side of the small-current-capacity IGBTs side. Further, the off-drive circuit 123 is connected to the common-connecting point of the resonance suppression resistors 120a and 120b. Thus, electric charge is released from the gates of the small-current-capacity IGBTs 110a and 110b via the diodes 125a and 125b, respectively. Accordingly, electric charge is reliably released from the gates of the small-current-capacity IGBTs 110a and 110b not via the resonance suppression resistors 120a and 120b.

According to the first embodiment, the control circuit 124 is connected to the diodes 125a and 125b. Thus, based on the forward voltage of the diodes 125a and 125b, the control circuit 124 controls the drive power circuit 121 to adjust the output voltage of the drive power circuit 121. Accordingly, as described above, the variation of the gate voltage can be suppressed when electric charge is released from the gates of the small-current-capacity IGBTs 110a and 110b, the variation being attributed to the change in the forward voltage of the diodes 125a and 125b.

Figure 3:
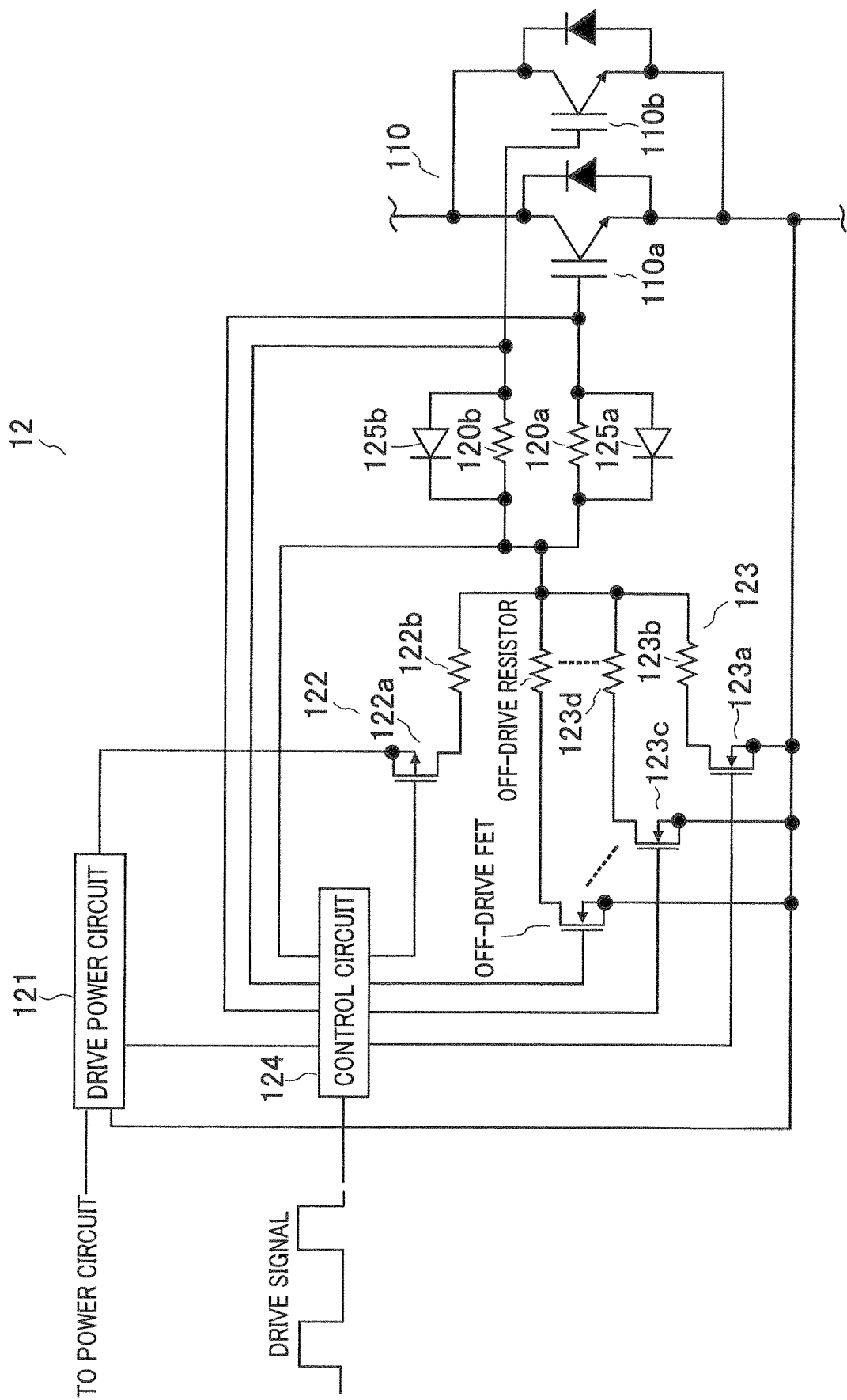
FIG. 3 is a circuit diagram illustrating a control unit according to a modification of the first embodiment.

The first embodiment is described, taking as an example of the case where the control circuit 124 controls the drive power circuit 121 on the basis of the forward voltage of the diodes 125a and 125b to adjust the output voltage of the drive power circuit 121. However, this shall not impose a limitation. As shown in FIG. 3, in addition to the off-drive FET 123c and the off-drive resistor 123d, the off-drive circuit 123 may include a plurality of off-drive resistors having mutually different resistances, each of which is smaller than the resistance of the resonance suppression resistors 120a and 120b. In this case, the control circuit 124 may control the off-drive circuit 123 on the basis of the forward voltage of the diodes 125a and 125b to change (select) the resistances of the off-drive resistors. Further, the control circuit 124 may control the on-drive circuit 122, or, specifically, the on-drive FET 122a, to adjust the output voltage of the on-drive circuit 122. In either of these cases, the variation of the to gate voltage can be suppressed when electric charge is released from the gates of the small-current-capacity IGBTs 110a and 110b, the variation being attributed to the change in the forward voltage of the diodes 125a and 125b.

The first embodiment is described, taking as an example of the case where the IGBT 110 is configured by parallelly connecting two small-current-capacity IGBTs 110a and 110b. However, this shall not impose a limitation. The IGBT may be configured by parallelly connecting three or more small-current-capacity IGBTs. In this case, a resonance suppression resistor is connected to the gate of each of the small-current-capacity IGBTs.

Second Embodiment

Hereinafter is described a motor control apparatus according to a second embodiment of the present invention. In contrast to the motor control apparatus of the first embodiment, there is a change in the motor control apparatus of the second embodiment in the configuration for connecting diodes to an off-drive circuit.

Figure 4:
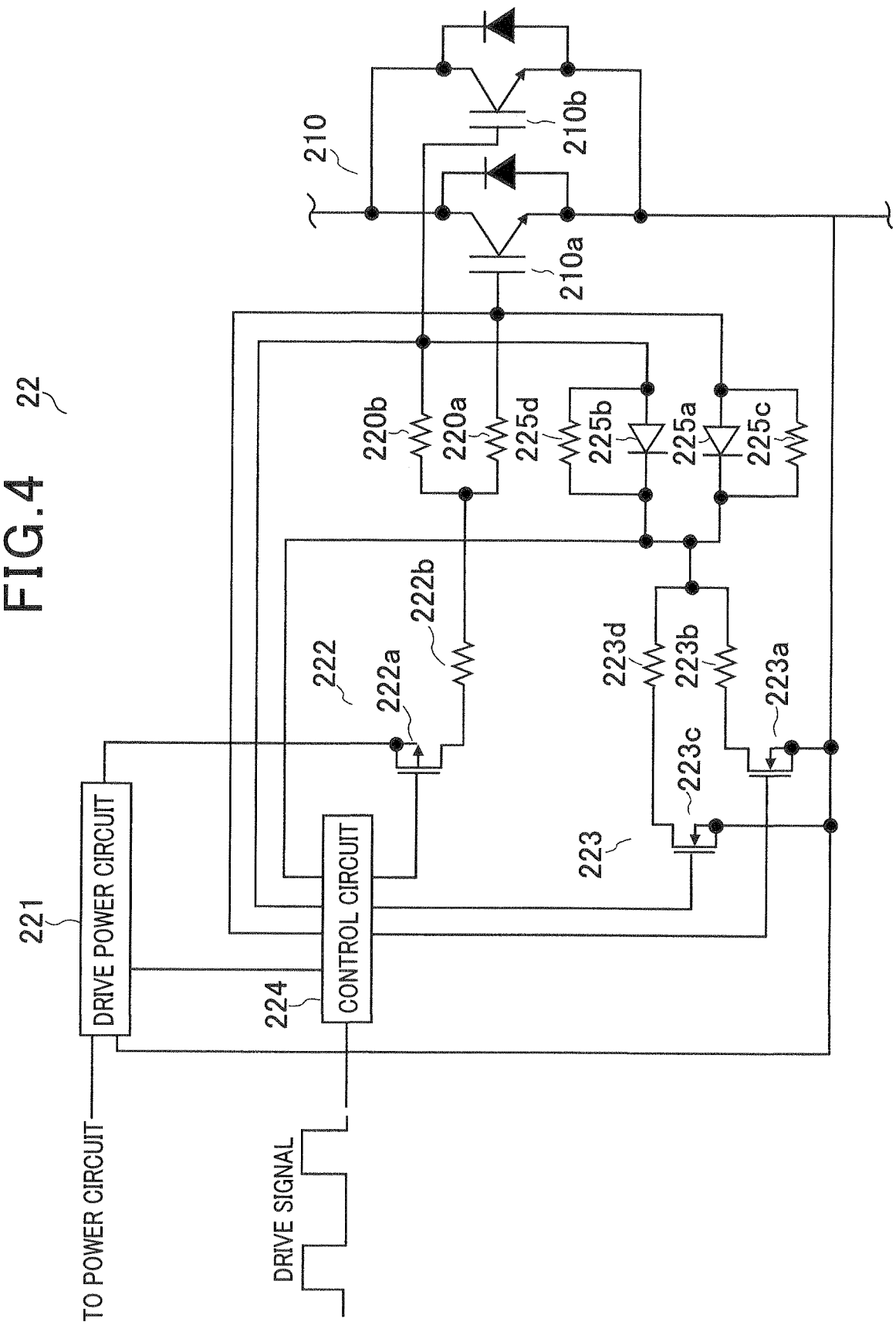
FIG. 4 is a circuit diagram illustrating a control unit according to a second embodiment of the present invention.

Referring first to FIG. 4, the configuration of the motor control apparatus of the second embodiment will be described.

As shown in FIG. 4, for an IGBT 210, a control unit 22 includes two resonance suppression resistors 220a and 220b (plurality of resonance suppression resistors), a drive power circuit 221, an on-drive circuit 222, an off-drive circuit 223, a control circuit 224, two diodes 225a and 225b (plurality of diodes) and two resistors 225c and 225d (plurality of resistors).

The configuration of the IGBT 210 is the same as that of the IGBT 110 of the first embodiment. Thus, the IGBT 210 is configured by connecting two small-current-capacity IGBTs 210a and 210b (plurality of switching elements) in parallel with each other.

The configurations of the resonance suppression resistors 220a and 220b, the drive power circuit 221 and the control circuit 224 are the same as those of the resonance suppression resistors 120a and 120b, the drive power circuit 121 and the control circuit 124, respectively, of the first embodiment.

The on-drive circuit 222 includes an on-drive FET 222a and an on-drive resistor 222b. The configurations of the on-drive FET 222a and the on-drive resistor 222b are the same as those of the on-drive FET 122a and the on-drive resistor 122b, respectively, of the first embodiment.

The off-drive circuit 223 includes off-drive FETs 223a and 223c, and off-drive resistors 223b and 223d. The configurations of the off-drive FETs 223a and 223c and the off-drive resistors 223b and 223d are the same as those of the off-drive FETs 123a and 123c and the off-drive resistors 123b and 123d, respectively, of the first embodiment, except for the position of connecting an end of the off-drive resistor 223b to an end of the off-drive resistor 223d.

The diodes 225a and 225b serve as elements that allow release of electric charge from the gates of the small-current-capacity IGBTs 210a and 210b, respectively, not via the resonance suppression resistors 220a and 220b. The diodes 225a and 225b also serve as elements that suppress current flow between the small-current-capacity IGBTs 210a and 210b during the release of electric charge to thereby suppress resonance. The diodes 225a and 225b have anodes that are connected to the gates of the small-current-capacity IGBTs 210a and 210b, respectively, and have cathodes having a common connection.

The resistors 225c and 225d serve as elements that finally equalize the potential at the gates of the small-current-capacity IGBTs 210a and 210b with the potential at the emitters thereof when electric charge is released from the gates. The resistors 225c and 225d have a resistance which is set to be equal to or more than the resistance of the resonance suppression resistors 220a and 220b. The resistors 225c and 225d are parallelly connected to the diodes 225a and 225b, respectively.

An end of the off-drive resistor 223b is connected to the cathode of the diode 225a, while an end of the off-drive resistor 223d is connected to the cathode of the diode 225b, the cathodes having a common connection.

Referring now to FIG. 4, hereinafter is described the operation for driving the IGBTs in the motor control apparatus of the second embodiment. Since the operation for turning on the small-current-capacity IGBTs 210a and 210b is the same as that of the first embodiment, description is omitted. Accordingly, hereinafter is described the operation for turning off the small-current-capacity IGBTs 210a and 210b.

When a drive signal has an instruction to turn off the small-current-capacity IGBTs 210a and 210b, the control circuit 224, which is shown in FIG. 4, turns off the on-drive FET 222a. At the same time, the control circuit 224 turns on the off-drive FET 223a or 223c in accordance with the collector-emitter current of the small-current-capacity IGBTs 210a and 210b.

If the off-drive FET 223a is turned on, current is permitted to flow out of the gates of the small-current-capacity IGBTs 210a and 210b via the diodes 225a and 225b, the off-drive resistor 223b and the off-drive FET 223a to thereby release electric charge from the gates. Then, finally, the gates of the small-current-capacity IGBTs 210a and 210b are connected to the respective emitters thereof via the resistors 225c and 225d, the off-drive resistor 223b and the off-drive FET 223a. Resultantly, the potential at the gates becomes equal to the potential at the emitters.

If the off-drive FET 223c is turned on, current is permitted to flow out of the gates of the small-current-capacity IGBTs 210a and 210b via the diodes 225a and 225b, the off-drive resistor 223d and the off-drive FET 223c to thereby release electric charge from the gates. Then, finally, the gates of the small-current-capacity IGBTs 210a and 210b are connected to the respective emitters thereof via the resistors 225c and 225d, the off-drive resistor 223d and the off-drive FET 223c. Resultantly, the potential at the gates becomes equal to the potential at the emitters.

As a result, the gate voltage becomes lower than an on/off threshold voltage and the small-current-capacity IGBTs 210a and 210b are turned off.

The advantageous effects of the motor control apparatus according to the second embodiment will be described.

According to the second embodiment, the anodes of the diodes 225a and 225b are connected to the gates of the small-current-capacity IGBTs 210a and 210b, respectively, and the cathodes thereof have a common connection. Further, the off-drive circuit 223 is connected to the common-connecting point of the diodes 225a and 225b, so that electric charge is released from the gates of the small-current-capacity IGBTs 210a and 210b via the diodes 225a and 225b. Thus, electric charge is reliably released from the gates of the small-current-capacity IGBTs 210a and 210b not via the resonance suppression resistors 220a and 220b.

According to the second embodiment, the resistors 225c and 225d are parallelly connected to the diodes 225a and 225b, respectively. Thus, finally, the potential at the gates of the small-current-capacity IGBTs 210a and 210b is equalized with the potential at the emitters thereof. Accordingly, the small-current-capacity IGBTs 210a and 210b are reliably turned off.

According to the second embodiment, a closed circuit is configured by the small-current-capacity IGBTs 210a and 210b and the resistors 225c and 225d. However, the resistance of the resistors 225c and 225d is equal to or more than the resistance of the resonance suppression resistors 220a and 220b. Therefore, the current flow between the small-current-capacity IGBTs 210a and 210b can be suppressed to thereby suppress resonance.

Third Embodiment

Hereinafter is described a motor control apparatus according to a third embodiment of the present invention. In contrast to the motor control apparatus of the first embodiment that releases electric charge from the gates of two small-current-capacity IGBTs via diodes, there are changes in the motor control apparatus of the third embodiment in the configuration of the off-drive circuit and the operation of the control circuit. With these changes, electric charge is ensured to be directly released from the gates of the two small-current-capacity IGBTs.

Figure 5:
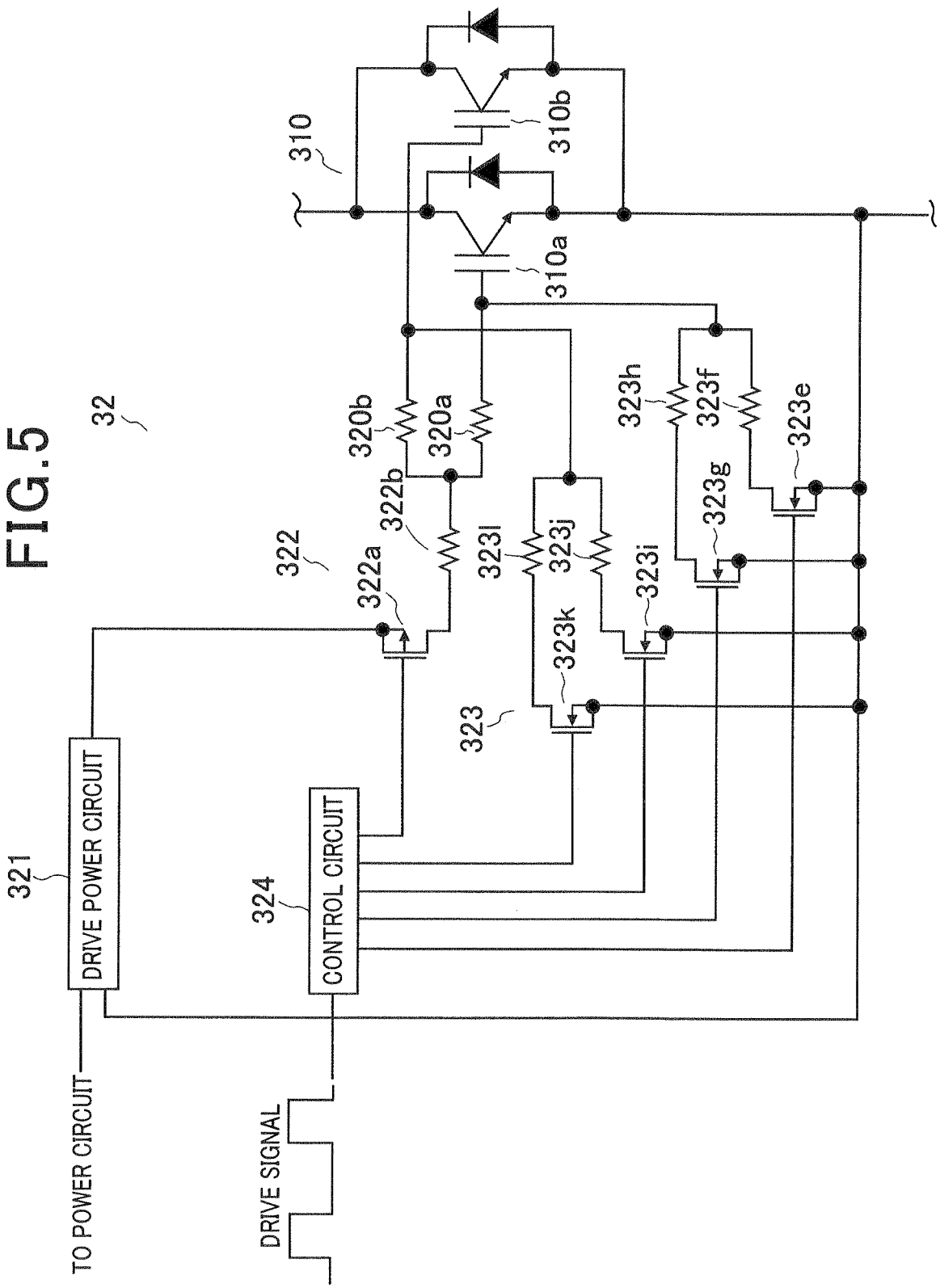
FIG. 5 is a circuit diagram illustrating a control unit according to a third embodiment of the present invention.

Referring to FIG. 5, the configuration of the motor control apparatus according to the third embodiment is described.

As shown in FIG. 5, for an IGBT 310, a control unit 32 includes two resonance suppression resistors 320a and 320b (plurality of resonance suppression resistors), a drive power circuit 321, an on-drive circuit 322, an off-drive circuit 323 and a control circuit 324.

The configuration of the IGBT 310 is the same as that of the IGBT 110 of the first embodiment. Thus, the IGBT 310 is configured by two small-current-capacity IGBTs 310a and 310b (plurality of switching elements) which are connected in parallel with each other.

The configurations of the resonance suppression resistors 320a and 320b are the same as those of the resonance suppression resistors 120a and 120b of the first embodiment.

The drive power circuit 321 of the third embodiment is different from the drive power circuit 121 of the first embodiment. Specifically, without being controlled by the control circuit 324, the drive power circuit 321 of the third embodiment converts the voltage supplied from a power circuit (not shown) to a predetermined voltage required for driving the small-current-capacity IGBTs 310a and 310 and supplies the converted voltage to the on-drive circuit 322. The drive power circuit 321 has an input terminal connected to the power circuit, a positive terminal connected to the on-drive circuit 322 and a negative terminal connected to the emitters of the small-current-capacity IGBTs 310a and 310b.

The on-drive circuit 322 includes an on-drive FET 322a and an on-drive resistor 322b. The configurations of the on-drive FET 322a and the on-drive resistor 322b are the same as those of the on-drive FET 122a and the on-drive resistor 122b, respectively, of the first embodiment.

The off-drive circuit 323 is controlled by the control circuit 324. Under the control, the off-drive circuit 323 allows the gates of the small-current-capacity IGBTs 310a and 310b to directly release electric charge to turn off the IGBTs 310a and 310b. The off-drive circuit 323 includes off-drive FETs 323e, 323g, 323i and 323k, and off-drive resistors 323f, 323h, 323j and 323l.

The off-drive FET 323e serves as an element that allows release of electric charge from the gate of the small-current-capacity IGBT 310a. The off-drive resistor 323f serves as an element that limits the current flowing out of the gate of the small-current-capacity IGBG 310a when release of electric charge from the gate of the IGBT 310a is allowed by the off-drive FET 323e. The off-drive resistor 323f has a resistance which is set to a value larger than that of the resistance of the resonance suppression resistors 320a and 320b. The off-drive FET 323e has a drain connected to an end of the off-drive resistor 323f. The other end of the off-drive resistor 323f is connected to the gate of the small-current-capacity IGBT 310a. The off-drive FET 323e has a source connected to the emitters of the small-current-capacity IGBTs 310a and 310b and has a gate connected to the control circuit 324.

The off-drive FET 323g serves as an element that allows release of electric charge from the gate of the small-current-capacity IGBT 310a. The off-drive resistor 323h serves as an element that limits the current flowing out of the gate of the small-current-capacity IGBT 310a when release of electric charge from the gate is allowed by the off-drive FET 323g. The off-drive resistor 323h has a resistance which is set to a value smaller than that of the resistance of the resonance suppression resistors 320a and 320b. The off-drive FET 323g has a drain connected to an end of the off-drive resistor 323h. The other end of the off-drive resistor 323h is connected to the gate of the small-current-capacity IGBT 310a. The off-drive FET 323g has a source connected to the emitters of the small-current-capacity IGBTs 310a and 310b and has a gate connected to the control circuit 324.

The off-drive FET 323i serves as an element that allows release of electric charge from the gate of the small-current-capacity IGBT 310b. The off-drive resistor 323j serves as an element that limits the current flowing out of the gate of the small-current-capacity IGBT 310b when release of electric charge from the gate is allowed by the off-drive FET 323i. The off-drive resistor 323j has a resistance which is set to a value larger than that of the resistance of the resonance suppression resistors 320a and 320b. The off-drive FET 323i has a drain connected to an end of the off-drive resistor 323j. The other end of the off-drive resistor 323j is connected to the gate of the small-current-capacity IGBT 310b. The off-drive FET 323i has a source connected to the emitters of the small-current-capacity IGBTs 310a and 310b and has a gate connected to the control circuit 324.

The off-drive FET 323k serves as an element that allows release of electric charge from the gate of the small-current-capacity IGBT 310b. The off-drive resistor 323l serves as an element that limits the current flowing out of the gate of the small-current-capacity IGBT 310b when release of electric charge from the gate is allowed by the off-drive FET 323k. The off-drive resistor 323l has a resistance which is set to a value smaller than that of the resistance of the resonance suppression resistors 320a and 320b. The off-drive FET 323k has a drain connected to an end of the off-drive resistor 323l. The other end of the off-drive resistor 323l is connected to the gate of the small-current-capacity IGBT 310b. The off-drive FET 323k has a source connected to the emitters of the small-current-capacity IGBTs 310a and 310b and has a gate connected to the control circuit 324.

The control circuit 324 controls the on-drive FET 322a and the off-drive FETs 323e, 323g, 323i and 323k to drive the small-current-capacity IGBTs 310a and 310. The control circuit 324 is connected to the gates of the on-drive FET 322a and the off-drive FETs 323e, 323g, 323i and 323k.

Referring to FIG. 5, hereinafter is described the operation for driving the IGBTs in the motor control apparatus of the third embodiment. Since the operation for turning on the small-current-capacity IGBTs 310a and 310b is the same as that of the first embodiment, description is omitted. Accordingly, hereinafter is described the operation for turning off the small-current-capacity IGBTs 310a and 310b.

When a drive signal has an instruction to turn off the small-current-capacity IGBTs 310a and 310b, the control circuit 324, which is shown in FIG. 5, turns off the on-drive FET 322a. At the same time, the control circuit 324 turns on the off-drive FETs 323e and 323i, or the off-drive FETs 323g and 323k in accordance with the collector-emitter current of the small-current-capacity IGBTs 310a and 310b.

If the off-drive FETs 323e and 323i are turned on, current is permitted to flow out of the gates of the small-current-capacity IGBTs 310a and 310b via the off-drive resistors 323f and 323j and the off-drive FETs 323e and 323i to thereby release electric charge from the gates. Then, finally, the gates of the small-current-capacity-IGBTs 310a and 310b are connected to the respective emitters thereof via the off-drive resistors 323f and 323j and the off-drive FETs 323e and 323i. Resultantly, the potential at the gates becomes equal to the potential at the emitters.

If the off-drive FETs 323g and 323k are turned on, current is permitted to flow out of the gates of the small-current-capacity IGBTs 310a and 310b via the off-drive resistors 323h and 323l and the off-drive FETs 323g and 323k to thereby release electric charge from the gates. Then, finally, the gates of the small-current-capacity-IGBTs 310a and 310b are connected to the respective emitters thereof via the off-drive resistors 323h and 323l and the off-drive FETs 323g and 323k. Resultantly, the potential at the gates becomes equal to the potential at the emitters.

As a result, the gate voltage becomes smaller than the on/off threshold voltage and the small-current-capacity IGBTs 310a and 310b are turned off.

Hereinafter, the advantageous effects of the motor control apparatus according to the third embodiment are described.

According to the third embodiment, the off-drive circuit 323 is connected to the gates of the small-current-capacity IGBTs 310a and 310b for the release of electric charge from the gates. Accordingly, electric charge is reliably released from the gates of the small-current-capacity IGBTs 310a and 310b not via the resonance suppression resistors 320a and 320b.

Fourth Embodiment

Hereinafter is described a motor control apparatus according to a fourth embodiment of the present invention. In contrast to the motor control apparatus of the first embodiment that releases electric charge from the gates of two small-current-capacity IGBTs via diodes, there are changes in the motor control apparatus of the fourth embodiment in the configurations of the on-drive circuit and the off-drive circuit and the operation of the control circuit. With these changes, electric charge is ensured to be applied to the gates of two small-current-capacity IGBTs via diodes.

Figure 6:
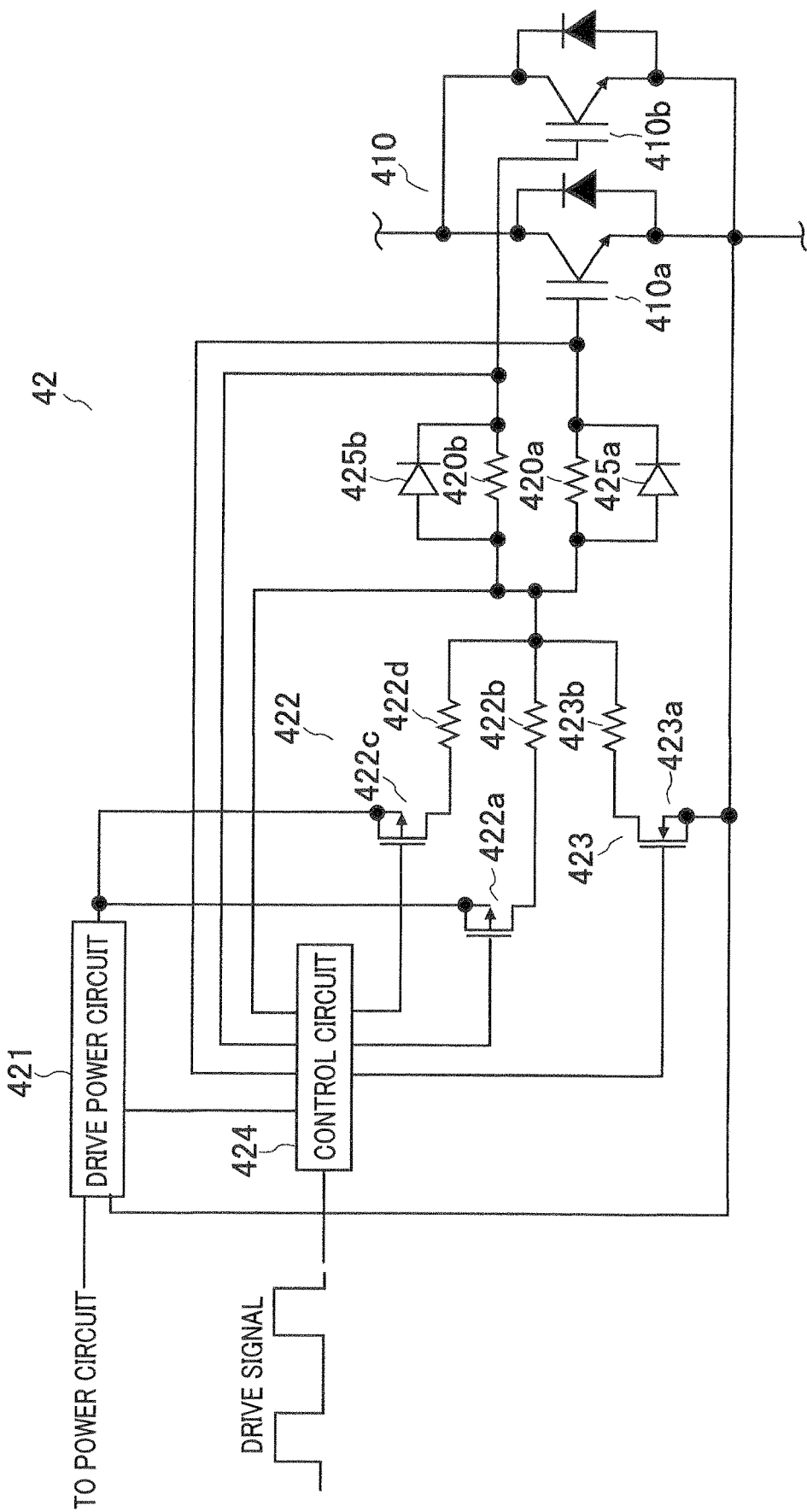
FIG. 6 is a circuit diagram illustrating a control unit according to a fourth embodiment of the present invention.

Referring to FIG. 6, the configuration of the motor control apparatus according to the fourth embodiment is described.

As shown in FIG. 6, for an IGBT 410, a control unit 42 includes two resonance suppression resistors 420a and 420b (plurality of resonance suppression resistors), a drive power circuit 421, an on-drive circuit 422, an off-drive circuit 423, a control circuit 424 and two diodes 425a and 425b (plurality of diodes).

The configuration of the IGBT 410 is the same as that of the IGBT 110 of the first embodiment. Thus, the IGBT 410 is configured by two small-current-capacity IGBTs 410a and 410b (plurality of switching elements) connected in parallel with each other.

The configurations of the resonance suppression resistors 420a and 420b and the drive power circuit 421 are the same as those of the resonance suppression resistors 120a and 120b and the drive power circuit 121, respectively, of the first embodiment.

The on-drive circuit 422 includes on-drive FETs 422a and 422c and on-drive resistors 422b and 422d.

The on-drive FET 422a serves as an element that applies electric charge to the gates of the small-current-capacity IGBTs 410a and 410b. The on-drive resistor 422b serves as an element that limits the current flowing into the gates of the small-current-capacity IGBTs 410a and 410b when electric charge is applied to the gates by the on-drive FET 422a. The on-drive resistor 422b has a resistance which is set to a value larger than that of the resistance of the resonance suppression resistors 420a and 420b. The on-drive FET 422a has a source connected to the positive terminal of the drive power circuit 421 and a drain connected to an end of the on-drive resistor 422b. The other end of the on-drive resistor 422b is connected to a common-connecting point of the resonance suppression resistors 420a and 420b. The on-drive FET 422a has a gate connected to the control circuit 424.

The on-drive FET 422c serves as an element that applies electric charge to the gates of the small-current-capacity IGBTs 410a and 410b. The on-drive resistor 422d serves as an element that limits the current flowing into the gates of the small-current-capacity IGBTs 410a and 410b when electric charge is applied to the gates by the on-drive FET 422c. The on-drive resistor 422d has a resistance which is set to a value smaller than that of the resistance of the resonance suppression resistors 420a and 420b. The on-drive FET 422c has a source connected to the positive terminal of the drive power circuit 421 and a drain connected to an end of the on-drive resistor 422d. The other end of the on-drive resistor 422d is connected to the common-connecting point of the resonance suppression resistors 420a and 420b. The on-drive FET 422c has a gate connected to the control circuit 424.

The off-drive circuit 423 includes an off-drive FET 423a and an off-drive resistor 423b. The configurations of the off-drive FET 423a and the off-drive resistor 423b are the same as those of the off-drive FET 123a and the off-drive resistor 123b, respectively, of the first embodiment.

The control circuit 424 controls the drive power circuit 421 on the basis of the forward voltage of the diodes 425a and 425b to adjust the output voltage of the drive power circuit 421. At the same time, the control circuit 424 controls the on-drive FETs 422a and 422c and the off-drive FET 423a on the basis of externally inputted drive signals to drive the small-current-capacity IGBTs 410a and 410b. The control circuit 424 is connected to the diodes 425a and 425b and the control terminal of the drive power circuit 421. Further, the control circuit 424 is also connected to the gates of the on-drive FETS 422a and 422c and the off-drive FET 423a.

The diodes 425a and 425b serve as elements that apply electric charge to the gates of the small-current-capacity IGBTs 410a and 410b, respectively not via the resonance suppression resistors 420a and 420b. The diodes 425a and 425b also serve as elements that suppress current flow between the small-current-capacity IGBTs 410a and 410b during the application of electric charge to thereby suppress resonance. The diodes 425a and 425b are parallelly connected to the resonance suppression resistors 420a and 420b, respectively. Specifically, the diode 425a has an anode that is connected to an end of the resonance suppression resistor 420a, the end being on the side opposite to the small-current-capacity IGBTs side, and has a cathode connected to the other end of the resonance suppression resistor 420a, the other end being on the small-current-capacity IGBTs side. Similarly, the diode 425b has an anode that is connected to an end of the resonance suppression resistor 420b, the end being on the side opposite to the small-current-capacity IGBTs side, and has a cathode connected to the other end of the resonance suppression resistor 420b, the other end being on the small-current-capacity IGBTs side.

Referring to FIG. 6, hereinafter is described the operation for driving the IGBTs in the motor control apparatus according to the fourth embodiment.

When a drive signal has an instruction to turn on the small-current-capacity IGBTs 410a and 410b, the control circuit 424, which is shown in FIG. 6, turns off the off-drive FET 423a. At the same time, the control circuit 424 turns on the on-drive FET 422a or 422c in accordance with the collector-emitter current of the small-current-capacity IGBTs 410a and 410b.

If the on-drive FET 422a is turned on, current is permitted to flow into the gates of the small-current-capacity IGBTs 410a and 410b from the drive power circuit 421 via the diodes 425a and 425b, and not via the on-drive FET 422a, the on-drive resistor 422b and the resonance suppression resistors 420a and 420b, to thereby apply electric charge to the gates. Then finally, the gates of the small-current-capacity IGBTs 410a and 410b are connected to the positive terminal of the drive power circuit 421 via the resonance suppression resistors 420a and 420b, the on-drive resistor 422b and the on-drive RET 422a. Resultantly, the potential at the gates becomes equal to the potential at the positive terminal of the drive power circuit 421.

If the on-drive FET 422c is turned on, current is permitted to flow into the gates of the small-current-capacity IGBTs 410a and 410b from the drive power circuit 421 via the diodes 425a and 425b, and not via the on-drive FET 422c, the on-drive resistor 422d and the resonance suppression resistors 420a and 420b, to thereby apply electric charge to the gates. Then finally, the gates of the small-current-capacity IGBTs 410a and 410b are connected to the positive terminal of the drive power circuit 421 via the resonance suppression resistors 420a and 420b, the on-drive resistor 422d and the on-drive FET 422c. Resultantly, the potential at the gates becomes equal to the potential at the positive terminal of the drive power circuit 421.

As a result, the gate voltage becomes larger than the on/off threshold voltage and the small-current-capacity IGBTs 410a and 410b are turned on.

In this case, the control circuit 424 controls the drive power circuit 421 on the basis of the forward voltage of the diodes 425a and 425b to adjust the output voltage of the drive power circuit 421. Specifically, if the forward voltage of the diodes 425a and 425b is larger than a predetermined voltage, the control circuit 424 steps down the output voltage of the drive power circuit 421 in accordance with the forward voltage of the diodes 425a and 425b. Conversely, if the forward voltage of the diodes 425a and 425b is smaller than the predetermined voltage, the control circuit 424 steps up the output voltage of the drive power circuit 421 in accordance with the forward voltage of the diodes 425a and 425b.

On the other hand, if a drive signal has an instruction to turn off the small-current-capacity IGBTs 410a and 410b, the control circuit 424 turns off the on-drive FETs 422a and 422c and, at the same time, turns on the off-drive FET 423a. Thus, current is permitted to flow out of the gates of the small-current-capacity IGBTs 410a and 410b via the resonance suppression resistors 420a and 420b, the off-drive resistor 423b and the off-drive FET 423a to thereby release electric charge from the gates. As a result, the gate voltage becomes lower than the on/off threshold voltage and the small-current-capacity IGBTs 410a and 410b are turned off.

The on-drive resistor 422b has a resistance which is set to a value larger than that of the resistance of the resonance suppression resistors 420a and 420b. On the other hand, the on-drive resistor 422d has a resistance which is set to a value smaller than that of the resistance of the resonance suppression resistors 420a and 420b. Therefore, when the on-drive FET 422c is turned on, the period in which electric charge is applied to the gates of the small-current-capacity IGBTs 410a and 410b, i.e. the time required for the IGBTs 410a and 410b to be turned on, can be shortened compared to when the on-drive FET 422a is turned on. Thus, the loss of the small-current-capacity IGBTs 410a and 410b can be suppressed.

The forward voltage of the diodes 425a and 425b depends on temperature. Specifically, when temperature rises, the forward voltage decreases and when temperature drops, the forward voltage increases. Therefore, due to the change in the forward voltage of the diodes 425a and 425b, the change being attributed to the change of temperature, the gate voltage of the small-current-capacity IGBTs 410a and 410b is unavoidably varied when electric charge is applied to the gates. However, as described above, the control circuit 424 controls the drive power circuit 421 on the basis of the forward voltage of the diodes 425a and 425b when electric charge is applied to the gates of the small-current-capacity IGBTs 410a and 410b to adjust the output voltage of the drive power circuit 421. Accordingly, the variation of the gate voltage can be suppressed when electric charge is applied to the gates of the IGBTs 410a and 410b, the variation being attributed to the change in the forward voltage of the diodes 425a and 425b.

Hereinafter, the advantageous effects of the motor control apparatus according to the fourth embodiment will be described.

According to the fourth embodiment, when a drive signal has an instruction to turn on the small-current-capacity IGBTs 410a and 410b, the control circuit 424 turns off the off-drive FET 423a. At the same time, in this case, the control circuit 424 turns on the on-drive FET 422a or 422c in accordance with the collector-emitter current of the small-current-capacity IGBTs 410a and 410b. The on-drive circuit 422 applies electric charge to the gates of the small-current-capacity IGBTs 410a and 410b not via the resonance suppression resistors 420a and 420b. Therefore, under the condition that the resistance of the on-drive resistor 422d is set to be smaller than that of the resonance suppression resistors 420a and 420b, electric charge can be applied to the gates of the IGBTs 410a and 410b without being influenced by the resonance suppression resistors 420a and 420b.

According to the fourth embodiment, the anode of the diode 425a is connected to an end of the resonance suppression resistor 420a, the end being on a side opposite to the small-current-capacity IGBTs side, and the cathode thereof is connected to the other end of the resonance suppression resistor 420a, the other end being on the small-current-capacity IGBTs side. Similarly, the anode of the diode 425b is connected to an end of the resonance suppression resistor 420b, the end being on a side opposite to the small-current-capacity IGBTs side, and the cathode thereof is connected to the other end of the resonance suppression resistor 420b, the other end being on the small-current-capacity IGBTs side. Further, the on-drive circuit 422 is connected to the common-connecting point of the resonance suppression resistors 420a and 420b to apply electric charge to the gates of the small-current-capacity IGBTs 410a and 410b via the diodes 425a and 425b. Accordingly, electric charge is reliably applied to the gates of the small-current-capacity IGBTs 410a and 410b not via the resonance suppression resistors 420a and 420b.

According to the fourth embodiment, the control circuit 424 is connected to the diodes 425a and 425b to control the drive power circuit 421 on the basis of the forward voltage of the diodes 425a and 425b and adjust the output voltage of the drive power circuit 421. Therefore, as described above, variation in the gate voltage can be suppressed in applying electric charge to the gates of the small-current-capacity IGBTs 410a and 410b, the variation being attributed to the change in the forward voltage of the diodes 425a and 425b.

Figure 7:
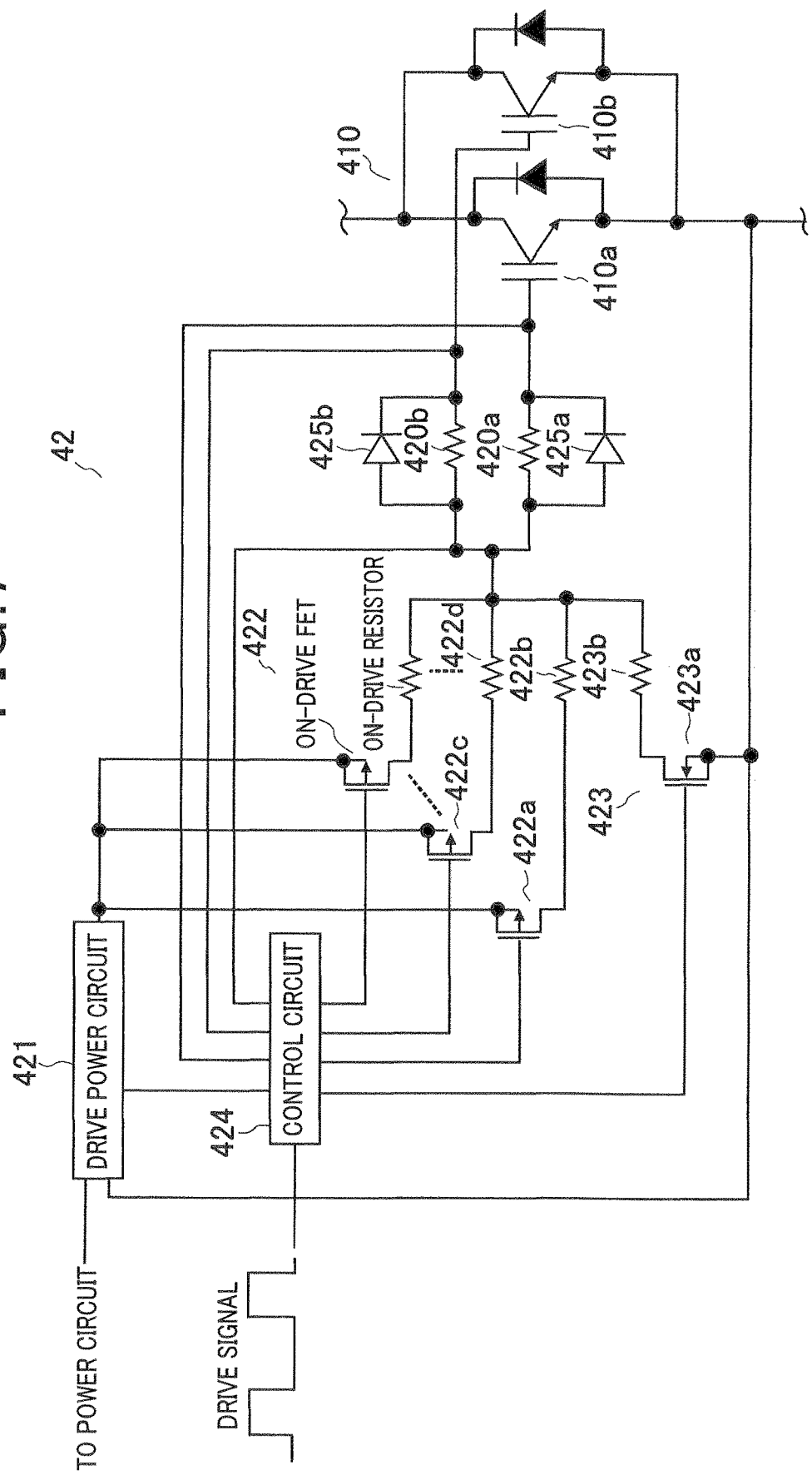
FIG. 7 is a circuit diagram illustrating a control unit according to a modification of the fourth embodiment.

The fourth embodiment deals with an example in which the control circuit 424 controls the drive power circuit 421 on the basis of the forward voltage of the diodes 425a and 425b to thereby adjust the output voltage of the drive power circuit 421. However, this shall not impose a limitation. As shown in FIG. 7, in addition to the on-drive FET 422c and the on-drive resistor 422d, the on-drive circuit 422 may have a plurality of on-drive resistors having mutually different resistances, each of which is smaller than the resistance of the resonance suppression resistors 420a and 420b. In this case, the control circuit 424 may control the on-drive circuit 422 on the basis of the forward voltage of the diodes 425a and 425b to switch the resistances of the off-drive resistors. Also, the control circuit 424 may control the on-drive circuit 422, or, specifically, the on-drive FET 422a, on the basis of the forward voltage of the diodes 425a and 425b to adjust the output voltage of the on-drive circuit 422. In either of the cases, variation in the gate voltage can be suppressed in applying electric charge to the gates of the small-current-capacity IGBTs 410a and 410b, the variation being attributed to the change in the forward voltage of the diodes 425a and 425b.

Further, the fourth embodiments deals with an example in which the IGBT 410 is configured by two small-current-capacity IGBTs 410a and 410b which are connected in parallel with each other. However, this shall not impose a limitation. An IGBT may be configured by three or more small-current-capacity IGBTs which are connected in parallel with each other. In this case, a resonance suppression resistor is connected to the gate of each of the small-current-capacity IGBTs.

Fifth Embodiment

Hereinafter is described a motor control apparatus according to a fifth embodiment of the present invention. In contrast to the motor control apparatus of the fourth embodiment, there is a change in the motor control apparatus of the fifth embodiment in the configuration for connecting between an on-drive circuit and diodes.

Figure 8:
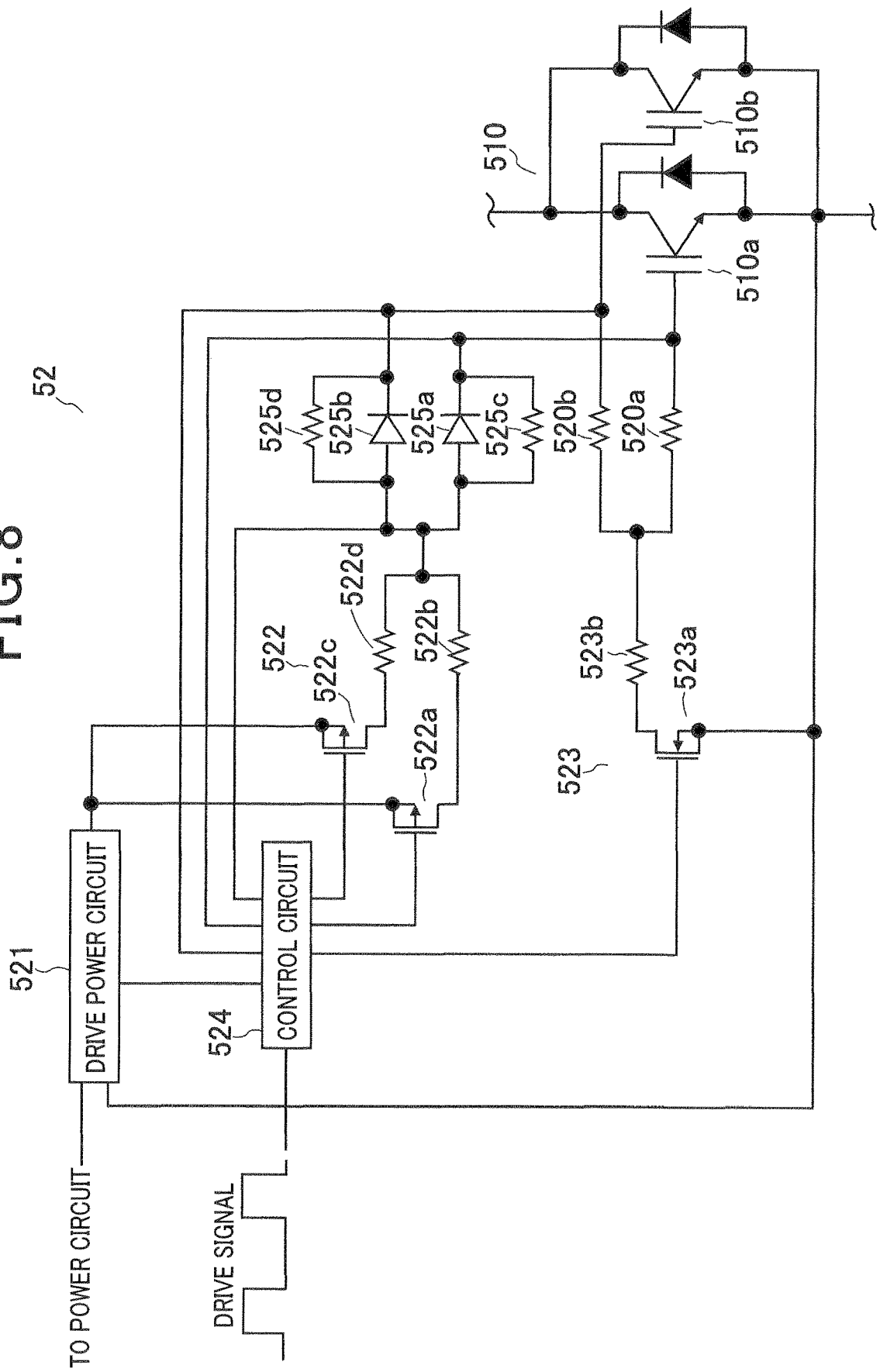
FIG. 8 is a circuit diagram illustrating a control unit according to a fifth embodiment of the present invention.

Referring to FIG. 8, the configuration of the motor control apparatus according to the fifth embodiment is described.

As shown in FIG. 8, for an IGBT 510, a control unit 52 includes two resonance suppression resistors 520a and 520b (plurality of resonance suppression resistors), a drive power circuit 521, an on-drive circuit 522, an off-drive circuit 523, a control circuit 524, two diodes 525a and 525b (plurality of diodes) and two resistors 525c and 525d (plurality of resistors).

The configuration of the IGBT 510 is the same as that of the IGBT 410 of the fourth embodiment. Thus, the IGBT 510 is configured by two small-current-capacity IGBTs 510a and 510b (plurality of switching elements) which are connected in parallel with each other.

The configurations of the resonance suppression resistors 520a and 520b, the drive power circuit 521 and the control circuit 524 are the same as those of the resonance suppression resistors 420a and 420b, the drive power circuit 421 and the control circuit 424, respectively, of the fourth embodiment.

The on-drive circuit 522 includes on-drive FETs 522a and 522c and on-drive resistors 522b and 522d. The configurations of the on-drive FETs 522a and 522c and the on-drive resistors 522b and 522d are the same as those of the on-drive FETS 422a and 422c and the on-drive resistors 422b and 422d, respectively, of the fourth embodiment, except for the position of connecting an end of the off-drive resistor 522b to an end of the off-drive resistor 522d.

The off-drive circuit 523 includes an off-drive FET 523a and an off-drive resistor 523b. The configurations of the off-drive FET 523a and the off-drive resistor 523b are the same as those of the off-drive FET 423a and the off-drive resistor 423b, respectively, of the fourth embodiment.

The diodes 525a and 525b serve as elements that apply electric charge to the gates of the small-current-capacity IGBTs 510a and 510b, respectively, not via the resonance suppression resistors 520a and 520b. The diodes 525a and 525b also serve as elements that suppress current flow between the small-current-capacity IGBTs 510a and 510b during the application of electric charge to thereby suppress resonance. The diodes 525a and 525b have anodes that have a common connection and cathodes connected to the gates of the respective small-current-capacity IGBTs 510a and 510b.

The resistors 525c and 525d serve as elements that finally equalize the potential at the gates of the small-current-capacity IGBTs 510a and 510b with the potential at the positive terminal of the drive power circuit 521 when electric charge is applied to the gates. The resistors 525c and 525d have a resistance which is set to be equal to or larger than the resistance of the resonance suppression resistors 520a and 520b. The resistors 525c and 525d are parallelly connected to the diodes 525a and 525b, respectively.

The on-drive resistor 522b has an end connected to the anode of the diode 525a, while the on-drive resistor 522d has an end connected to the anode of the diode 525b. The anodes of the diodes 525a and 525b have a common connection.

Referring to FIG. 8, hereinafter is described the operation for driving the IGBTs in the motor control apparatus of the fifth embodiment. Since the operation for turning off the small-current-capacity IGBTs 510a and 510b is the same as that of the fourth embodiment, description is omitted. Accordingly, the operation for turning on the small-current-capacity IGBTs 510a and 510b is described.

When a drive signal has an instruction to turn on the small-current-capacity IGBTs 510a and 510b, the control circuit 524, which is shown in FIG. 8, turns off the off-drive FET 523a. At the same time, the control circuit 524 turns on the on-drive FET 522a or 522c in accordance with the collector-emitter current of the small-current-capacity IGBTs 510a and 510b.

If the on-drive FET 522a is turned on, current is permitted to flow into the gates of the small-current-capacity IGBTs 510a and 510b from the drive power circuit 521 via the on-drive FET 522a, the on-drive resistor 522b and the diodes 525a and 525b to thereby apply electric charge to the gates. Then, finally, the gates of the small-current-capacity IGBTs 510a and 510b are connected to the positive terminal of the drive power circuit 521 via the resistors 525c and 525d, the on-drive resistor 522b and the on-drive FET 522a. Resultantly, the potential at the gates becomes equal to the potential at the positive terminal of the drive power circuit 521.

If the on-drive FET 522c is turned on, current is permitted to flow into the gates of the small-current-capacity IGBTs 510a and 510b from the drive power circuit 521 via the on-drive FET 522c, the on-drive resistor 522d and the diodes 525a and 525b to thereby apply electric charge to the gates. Then, finally, the gates of the small-current-capacity IGBTs 510a and 510b are connected to the positive terminal of the drive power circuit 521 via the resistors 525c and 525d, the on-drive resistor 522d and the on-drive FET 522c. Resultantly, the potential at the gates becomes equal to the potential at the positive terminal of the drive power circuit 521.

As a result, the gate voltage becomes larger than the on/off threshold voltage, and the small-current-capacity IGBTs 510a and 510b are turned on.

Hereinafter are described the advantageous effects of the motor control apparatus of the fifth embodiment.

According to the fifth embodiment, the anodes of the diodes 525a and 525b have a common connection, and the cathodes thereof are connected to the gates of the respective small-current-capacity IGBTs 510a and 510b. Further, the on-drive circuit 522 is connected to the common-connecting point of the diodes 525a and 525b to apply electric charge to the gates of the small-current-capacity IGBTs 510a and 510b via the diodes 525a and 525b. Accordingly, electric charge is reliably applied to the gates of the small-current-capacity IGBTs 510a and 510b not via the resonance suppression resistors 520a and 520b.

According to the fifth embodiment, the resistors 525c and 525d are parallelly connected to the diodes 525a and 525b, respectively. Accordingly, finally, the potential at the gates of the small-current-capacity IGBTs 510a and 510b are equalized with the potential at the positive terminal of the drive power circuit 521. Thus, the small-current-capacity IGBTs 510a and 510b are reliably turned on.

According to the fifth embodiment, a closed circuit is configured by the small-current-capacity IGBTs 510a and 510b and the resistors 525c and 525d. However, the resistance of the resistors 525c and 525d is set to be equal to or larger than the resistance of the resonance suppression resistors 520a and 520b. Therefore, the current flow between the small-current-capacity IGBTs 510a and 510b can be suppressed to thereby suppress resonance.

Sixth Embodiment

Hereinafter is described a motor control apparatus according to a sixth embodiment of the present invention. In contrast to the motor control apparatus of the fourth embodiment that applies electric charge to the gates of two small-current capacity IGBTs via diodes, there are changes in the motor control apparatus of the sixth embodiment in the configuration of the on-drive circuit and in the operation of the control circuit. With these changes, electric charge is ensured to be directly applied to the gates of two small-current-capacity IGBTs.

Figure 9:
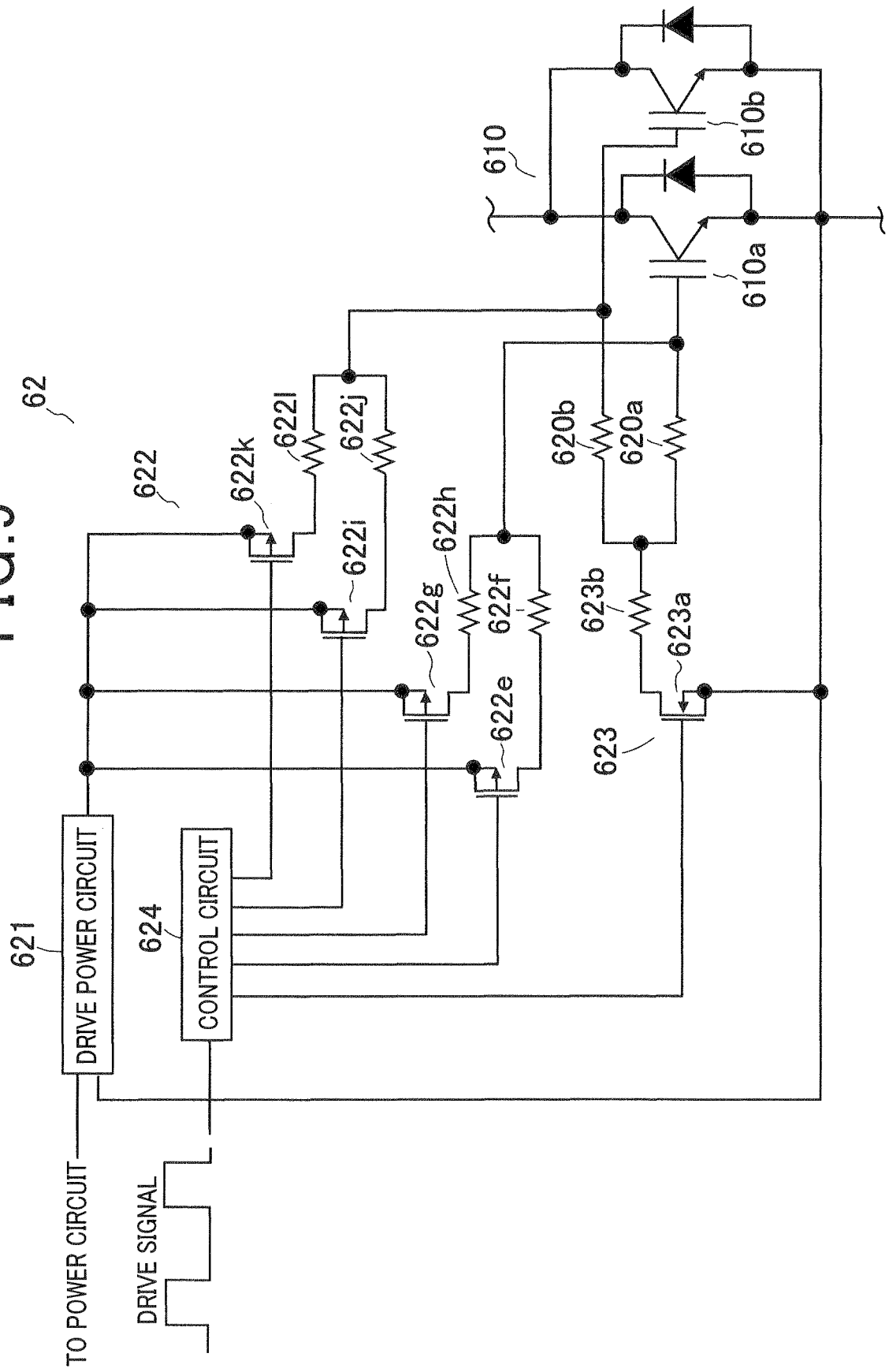
FIG. 9 is a circuit diagram illustrating a control unit according to a sixth embodiment of the present invention.

Referring to FIG. 9, the configuration of the motor control apparatus according to the sixth embodiment is described.

As shown in FIG. 9, for an IGBT 610, a control unit 62 includes two resonance suppression resistors 620a and 620b (plurality of resonance suppression resistors), a drive power circuit 621, an on-drive circuit 622, an off-drive circuit 623 and a control circuit 624.

The configuration of the IGBT 610 is the same as that of the IGBT 410 of the fourth embodiment. Thus, the IGBT 610 is configured by two small-current-capacity IGBTs 610a and 610b (plurality of switching elements) which are connected in parallel with each other.

The configurations of the resonance suppression resistors 620a and 620b are the same as those of the resonance suppression resistors 420a and 420b of the fourth embodiment.

The drive power circuit 621, unlike the drive power circuit 421 of the fourth embodiment, is not controlled by the control circuit 624. Specifically, without being controlled by the control circuit 624, the drive power circuit 621 converts the voltage supplied from a power circuit (not shown) to a predetermined voltage required for driving the small-current-capacity IGBTs 610*a* and 610*b* and supplies the converted voltage to the on-drive circuit 622. The drive power circuit 621 has an input terminal connected to the power circuit, a positive terminal connected to the on-drive circuit 622 and a negative terminal connected to the emitters of the small-current-capacity IGBTs 610*a* and 610*b*.

The on-drive circuit 622 is controlled by the control circuit 624 to apply electric charge to the gates of the small-current-capacity IGBTs 610*a* and 610*b* and turn on the IGBTs 610*a* and 610*b*. The on-drive circuit 622 includes on-drive FETs 622*e*, 622*g*, 622*i* and 622*k* and on-drive resistors 622*f*, 622*h*, 622*j* and 622*l*.

The on-drive FET 622*e* serves as an element that applies electric charge to the gate of the small-current-capacity IGBT 610*a*. The on-drive resistor 622*f* serves as an element that limits the current flowing into the gate of the small-current-capacity IGBT 610*a* when electric charge is applied to the gate by the on-drive FET 622*e*. The on-drive resistor 622*f* has a resistance which is set to a value larger than that of the resistance of the resonance suppression resistors 620*a* and 620*b*. The on-drive FET 622*e* has a source connected to the positive terminal of the drive power circuit 621 and a drain connected to an end of the on-drive resistor 622*f*. The other end of the on-drive resistor 622*f* is connected to the gate of the small-current-capacity IGBT 610*a*. Further, the on-drive FET 622*e* has a gate connected to the control circuit 624.

The on-drive FET 622*g* serves as an element that applies electric charge to the gate of the small-current-capacity IGBT 610*a*. The on-drive resistor 622*h* serves as an element that limits the current flowing into the gate of the small-current-capacity IGBT 610*a* when electric charge is applied to the gate by the on-drive FET 622*g*. The on-drive resistor 622*h* has a resistance which is set to a value smaller than that of the resistance of the resonance suppression resistors 620*a* and 620*b*. The on-drive FET 622*g* has a source connected to the positive terminal of the drive power circuit 621 and a drain connected to an end of the on-drive resistor 622*h*. The other end of the on-drive resistor 622*h* is connected to the gate of the small-current-capacity IGBT 610*a*. Further, the on-drive FET 622*g* has a gate connected to the control circuit 624.

The on-drive FET 622*i* serves as an element that applies electric charge to the gate of the small-current-capacity IGBT 610*b*. The on-drive resistor 622*j* serves as an element that limits the current flowing into the gate of the small-current-capacity IGBT 610*b* when electric charge is applied to the gate by the on-drive FET 622*i*. The on-drive resistor 622*j* has a resistance which is set to a value larger than that of the resistance of the resonance suppression resistors 620*a* and 620*b*. The on-drive FET 622*i* has a source connected to the positive terminal of the drive power circuit 621 and a drain connected to an end of the on-drive resistor 622*j*. The other end of the on-drive resistor 622*j* is connected to the gate of the small-current-capacity IGBT 610*b*. Further, the on-drive FET 622*i* has a gate connected to the control circuit 624.

The on-drive FET 622*k* serves as an element that applies electric charge to the gate of the small-current-capacity IGBT 610*b*. The on-drive resistor 622*l* serves as an element that limits the current flowing into the gate of the small-current-capacity IGBT 610*b* when electric charge is applied to the gate by the on-drive FET 622*k*. The on-drive resistor 622*l* has a resistance which is set to a value smaller than that of the resistance of the resonance suppression resistors 620*a* and 620*b*. The on-drive FET 622*k* has a source connected to the positive terminal of the drive power circuit 621 and a drain connected to an end of the on-drive resistor 622*l*. The other end of the on-drive resistor 622*l* is connected to the gate of the small-current-capacity IGBT 610*b*. Further, the on-drive FET 622*k* has a gate connected to the control circuit 624.

The off-drive circuit 623 includes an off-drive FET 623*a* and an off-drive resistor 623*b*. The configurations of the off-drive FET 623*a* and the off-drive resistor 623*b* are the same as those of the off-drive FET 423*a* and the off-drive resistor 423*b*, respectively, of the fourth embodiment.

The control circuit 624 controls the on-drive FETs 622*e*, 622*g*, 622*i* and 622*k* and the off-drive FET 623*a* to drive the small-current-capacity IGBTs 610*a* and 610*b*. The control circuit 624 is connected to the gates of the on-drive FETs 622*e*, 622*g*, 622*i* and 622*k* and the off-drive FET 623*a*.

Referring to FIG. 9, hereinafter is described the operation for driving the IGBTs in the motor control apparatus of the sixth embodiment. Since the operation for turning off the small-current-capacity IGBTs 610*a* and 610*b* is the same as that of the fourth embodiment, description is omitted. Accordingly, the operation for turning on the small-current-capacity IGBTs 610*a* and 610*b* is described.

When a drive signal has an instruction to turn on the small-current-capacity IGBTs 610*a* and 610*b*, the control circuit 624, which is shown in FIG. 9, turns off the off-drive FET 623*a*. At the same time, the control circuit 624 turns on the on-drive FETs 622*e* and 622*i*, or the on-drive FETs 622*g* and 622*k*, in accordance with the collector-emitter current of the small-current-capacity IGBT 610*a* and 610*b*.

If the on-drive FETs 622*e* and 622*i* are turned on, current is permitted to flow into the gates of the small-current-capacity IGBTs 610*a* and 610*b* from the drive power circuit 621 via the on-drive FETs 622*e* and 622*i* and the on-drive resistors 622*f* and 622*j* to thereby apply electric charge to the gates. Then, finally, the gates of the small-current-capacity IGBTs 610*a* and 610*b* are connected to the positive terminal of the drive power circuit 621 via the on-drive resistors 622*f* and 622*j* and the on-drive FETs 622*e* and 622*i*. Resultantly, the potential at the gates becomes equal to the potential at the positive terminal of the drive power circuit 621.

If the on-drive FETs 622*g* and 622*k* are turned on, current is permitted to flow into the gates of the small-current-capacity IGBTs 610*a* and 610*b* from the drive power circuit 621 via the on-drive FETs 622*g* and 622*k* and the on-drive resistors 622*h* and 622*l* to thereby apply electric charge to the gates. Then, finally, the gates of the small-current-capacity IGBTs 610*a* and 610*b* are connected to the positive terminal of the drive power circuit 621 via the on-drive resistors 622*h* and 622*l* and the on-drive FETs 622*g* and 622*k*. Resultantly, the potential at the gates becomes equal to the potential at the positive terminal of the drive power circuit 621.

As a result, the gate voltage becomes larger than the on/off threshold voltage and the small-current-capacity IGBTs 610*a* and 610*b* are turned on.

The motor control apparatus of the sixth embodiment has advantageous effects as follows.

According to the sixth embodiment, the on-drive circuit 622 is connected to the gates of the small-current-capacity IGBTs 610*a* and 610*b* to apply electric charge to the gates. Thus, electric charge is reliably applied to the gates of the small-current-capacity IGBTs 610*a* and 610*b* not via the resonance suppression resistors 620*a* and 620*b*.

Hereinafter, aspects of the above-described embodiments will be summarized.

As an aspect of the embodiment, an electronic apparatus is provided which includes: a plurality of switching elements each of which has an input terminal, an output terminal and a control terminal, the input terminals having a common connection, and the output terminals having a common connection, and each of which is driven by controlling voltage at the control terminal; a plurality of resonance suppression resistors each of which has a first end and a second end, the first ends being connected to the respective control terminals of the switching elements, and the second ends having a common connection; an on-drive circuit which has at least one on-drive resistor and is connected to a drive power circuit, and which is supplied with voltage from the drive power circuit and applies electric charge to the control terminals of the switching elements via the on-drive resistor to turn on the switching elements; and an off-drive circuit which has an off-drive resistor and releases electric charge from the control terminals of the switching elements via the off-drive resistor to turn off the switching elements. A resistance of the off-drive resistor is set to be smaller than a resistance of the resonance suppression resistors. The off-drive circuit releases electric charge from the control terminals of the switching elements not via the resonance suppression resistors.

According to this configuration, under the condition that the off-drive resistors have a resistance which is set to be smaller than the resistance of the resonance suppression resistor, electric charge is released from the control terminals of the switching elements without being influenced by the resonance suppression resistors.

As another aspect of the embodiment, an electronic apparatus is provided which includes: a plurality of switching elements each of which has an input terminal, an output terminal and a control terminal, the input terminals having a common connection, and the output terminals having a common connection, and each of which is driven by controlling voltage at the control terminal; a plurality of resonance suppression resistors each of which has a first end and a second end, the first ends being connected to the respective control terminals of the switching elements, and the second ends having a common connection; an on-drive circuit which has at least one on-drive resistor and is connected to a drive power circuit, and which is supplied with voltage from the drive power circuit and applies electric charge to the control terminals of the switching elements via the on-drive resistor to turn on the switching elements; and an off-drive circuit which has an off-drive resistor and releases electric charge from the control terminals of the switching elements via the off-drive resistor to turn off the switching elements. A resistance of the on-drive resistor is set to be smaller than a resistance of the resonance suppression resistors. The on-drive circuit applies electric charge to the control terminals of the switching elements not via the resonance suppression resistors.

According to this configuration, under the condition that the off-drive resistor has a resistance which is set be smaller than the resistance of the resonance suppression resistors, electric charge is applied to the control terminals of the switching elements without being influenced by the resonance suppression resistors.

It will be appreciated that the present invention is not limited to the configurations described above, but any and all modifications, variations or equivalents, which may occur to those who are skilled in the art, should be considered to fall within the scope of the present invention.

What is claimed is:

1. An electronic apparatus, comprising:
a plurality of switching elements each of which has an input terminal, an output terminal and a control terminal, the input terminals having a common connection, and the output terminals having a common connection, and each of which is driven by controlling voltage at the control terminal;
a plurality of resonance suppression resistors each of which has a first end and a second end, the first ends being connected to the respective control terminals of the switching elements, and the second ends having a common connection;
an on-drive circuit which has at least one on-drive resistor and is connected to a drive power circuit, and which is supplied with voltage from the drive power circuit and applies electric charge to the control terminals of the switching elements via the on-drive resistor to turn on the switching elements;
an off-drive circuit which has an off-drive resistor and releases electric charge from the control terminals of the switching elements via the off-drive resistor to turn off the switching elements;
a plurality of diodes each of which has an anode and a cathode, the anodes being connected to a switching elements side of the respective resonance suppression resistors, and the cathodes being connected to an opposite side of the switching elements side of the respective resonance suppression resistors; and
a control circuit which is connected to the diodes and controls the drive power circuit on the basis of forward voltage of the diodes to adjust output voltage of the drive power circuit, wherein
a resistance of the off-drive resistor is set to be smaller than a resistance of the resonance suppression resistors,
the off-drive circuit releases electric charge from the control terminals of the switching elements not via the resonance suppression resistors,
the off-drive circuit is connected to a common-connecting point of the resonance suppression resistors and releases electric charge from the control terminals of the switching elements via the diodes,
if the forward voltage of the diodes is larger than a predetermined voltage, the control circuit steps down the output voltage of the drive power circuit in accordance with the forward voltage of the diodes, and
if the forward voltage of the diodes is smaller than the predetermined voltage, the control circuit steps up the output voltage of the drive power circuit in accordance with the forward voltage of the diodes.

2. The electronic apparatus according to claim 1, wherein
the off-drive circuit has the plural off-drive resistors having mutually different resistances, and
the control circuit controls the off-drive circuit on the basis of the forward voltage of the diodes to change resistances of the off-drive resistors.

3. An electronic apparatus, comprising:
a plurality of switching elements each of which has an input terminal, an output terminal and a control terminal, the input terminals having a common connection, and the output terminals having a common connection, and each of which is driven by controlling voltage at the control terminal;
a plurality of resonance suppression resistors each of which has a first end and a second end, the first ends being connected to the respective control terminals of the switching elements, and the second ends having a common connection;

an on-drive circuit which has at least one on-drive resistor and is connected to a drive power circuit, and which is supplied with voltage from the drive power circuit and applies electric charge to the control terminals of the switching elements via the on-drive resistor to turn on the switching elements;

an off-drive circuit which has an off-drive resistor and releases electric charge from the control terminals of the switching elements via the off-drive resistor to turn off the switching elements;

a plurality of diodes each of which has an anode and a cathode, the anodes being connected to an opposite side of a switching elements side of the respective resonance suppression resistors, and the cathodes being connected to the switching elements side of the respective resonance suppression resistors; and a control circuit which is connected to the diodes and controls the drive power circuit on the basis of forward voltage of the diodes to adjust output voltage of the drive power circuit, wherein a resistance of the on-drive resistor is set to be smaller than a resistance of the resonance suppression resistors, the on-drive circuit applies electric charge to the control terminals of the switching elements not via the resonance suppression resistors, the on-drive circuit is connected to a common-connecting point of the resonance suppression resistors and applies electric charge from the control terminals of the switching elements via the diodes, if the forward voltage of the diodes is larger than a predetermined voltage, the control circuit steps down the output voltage of the drive power circuit in accordance with the forward voltage of the diodes, and if the forward voltage of the diodes is smaller than the predetermined voltage, the control circuit steps up the output voltage of the drive power circuit in accordance with the forward voltage of the diodes.

4. The electronic apparatus according to claim 3, wherein the on-drive circuit has the plural on-drive resistors having mutually different resistances, and the control circuit controls the on-drive circuit on the basis of the forward voltage of the diodes to change resistances of the on-drive resistors.

5. The electronic apparatus according to claim 1, wherein the control circuit turns off a switch element of the on-drive circuit and turns on a switch element of the off-drive circuit in accordance with a current of said plurality of switching elements.

6. The electronic apparatus according to claim 1, wherein the predetermined voltage is a voltage required for driving the plurality of switching elements.

7. The electronic apparatus according to claim 3, wherein the predetermined voltage is a voltage required for driving the plurality of switching elements.

* * * * *